United States Patent
Kim

(10) Patent No.: US 10,243,588 B2
(45) Date of Patent: Mar. 26, 2019

(54) ERROR CORRECTION CODE (ECC) DECODERS SHARING LOGIC OPERATIONS, MEMORY CONTROLLERS INCLUDING THE ERROR CORRECTION CODE DECODERS, AND METHODS OF DECODING ERROR CORRECTION CODES

(71) Applicant: SK hynix Inc., Icheon-si, Gyeonggi-do (KR)

(72) Inventor: Soojin Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/653,730

(22) Filed: Jul. 19, 2017

(65) Prior Publication Data

US 2018/0198468 A1 Jul. 12, 2018

(30) Foreign Application Priority Data

Jan. 11, 2017 (KR) .................. 10-2017-0004429

(51) Int. Cl.
| | |
|---|---|
| *H03M 13/15* | (2006.01) |
| *G06F 11/10* | (2006.01) |
| *G11C 29/42* | (2006.01) |
| *H03M 13/11* | (2006.01) |
| *G11C 11/409* | (2006.01) |
| *G11C 29/00* | (2006.01) |
| *G11C 29/04* | (2006.01) |

(52) U.S. Cl.
CPC ....... *H03M 13/1515* (2013.01); *G06F 11/106* (2013.01); *G06F 11/1016* (2013.01); *G06F 11/1076* (2013.01); *G11C 11/409* (2013.01); *G11C 29/42* (2013.01); *G11C 29/816* (2013.01); *H03M 13/11* (2013.01); *H03M 13/15* (2013.01); *H03M 13/152* (2013.01); *G11C 2029/0411* (2013.01)

(58) Field of Classification Search
CPC .. H03M 13/1515; H03M 13/11; H03M 13/15; H03M 13/152; G06F 11/1016; G06F 11/106; G06F 11/1076; G11C 11/409; G11C 29/42; G11C 29/816; G11C 2029/0411
USPC ....... 714/758, 763, 768, 773, 782, 784, 785, 714/799; 365/200, 201, 185.09
See application file for complete search history.

(56) References Cited

U.S. PATENT DOCUMENTS

| | | | |
|---|---|---|---|
| 5,463,642 A | 10/1995 | Gibbs et al. | |
| 6,374,383 B1 * | 4/2002 | Weng ................ | H03M 13/1515 714/781 |

(Continued)

*Primary Examiner* — John J Tabone, Jr.
(74) *Attorney, Agent, or Firm* — William Park & Associates Ltd.

(57) ABSTRACT

An error correction code (ECC) decoder includes a finite state machine (FSM) controller and a shared logic circuit. The FSM controller generates a first control signal and a second control signal each corresponding to a certain state. The shared logic circuit includes a plurality of shared Galois field (GF) multipliers, a plurality of shared XOR arithmetic elements, and a plurality of shared multiplexers (MUXs), which are used for an operation selected between a syndrome operation, an error location polynomial operation, an error location operation and an error correction operation, in response to the first and second control signals.

18 Claims, 19 Drawing Sheets

(56) References Cited

U.S. PATENT DOCUMENTS

| | | | | |
|---|---|---|---|---|
| 7,058,876 B1* | 6/2006 | Ireland | ............... | H03M 13/153 |
| | | | | 714/781 |
| 7,096,408 B1* | 8/2006 | Ireland | .................... | G06F 7/724 |
| | | | | 714/784 |
| 2003/0101406 A1* | 5/2003 | Song | .................... | H03M 13/00 |
| | | | | 714/774 |
| 2003/0106014 A1* | 6/2003 | Dohmen | ........... | H03M 13/1535 |
| | | | | 714/785 |
| 2003/0142764 A1* | 7/2003 | Keevill | ................ | H04L 27/265 |
| | | | | 375/341 |
| 2004/0010742 A1* | 1/2004 | Williamson | ...... | H03M 13/1515 |
| | | | | 714/746 |
| 2010/0251068 A1* | 9/2010 | Lin | .................... | G06F 11/1068 |
| | | | | 714/755 |
| 2014/0181614 A1* | 6/2014 | Kwok | ............... | H03M 13/1515 |
| | | | | 714/755 |
| 2015/0128011 A1* | 5/2015 | Rochman | .......... | H03M 13/1545 |
| | | | | 714/773 |
| 2017/0288700 A1* | 10/2017 | Park | ................... | H03M 13/152 |
| 2018/0152203 A1* | 5/2018 | Kim | ................... | H03M 13/151 |

\* cited by examiner

FIG.14

\* Initialization:

$\delta_{3t}(0) = 1$ $\delta_i(0) = 0 \ (for \ i = 2t, 2t+1, \cdots, 3t-1)$ $\delta_{3t+1}(r) = 0$ $k(0) = 0$ $\gamma(0) = 1$ \* Input: $S_i, (i = 0, 1, \cdots, 2t-1)$ $\delta_i(0) = \theta_i(0) = S_i, (i = 0, 1, \cdots, 2t-1)$ for r = 0 step 1 until 2t − 1 do begin

RiBM1. $\delta_i(r+1) = \gamma(r) \cdot \delta_{i+1}(r) - \delta_0(r)\theta_i(r), (i = 0, 1, \cdots, 3t)$

RiBM2. if $\delta_0(r) \neq 0$ and $k(r) \geq 0$ then begin $\theta_i(r+1) = \delta_{i+1}(r), (i = 0, 1, \cdots, 3t)$ $\gamma(r+1) = \delta_0(r)$ $k(r+1) = -k(r) - 1$ end else begin $\theta_i(r+1) = \theta_i(r), (i = 0, 1, \cdots, 3t)$ $\gamma(r+1) = \gamma(r)$ $k(r+1) = k(r) + 1$ end end

Output: $\lambda_i(2t) = \delta_{t+i}(2t), (i = 0, 1, \cdots, t)$

ERROR CORRECTION CODE (ECC) DECODERS SHARING LOGIC OPERATIONS, MEMORY CONTROLLERS INCLUDING THE ERROR CORRECTION CODE DECODERS, AND METHODS OF DECODING ERROR CORRECTION CODES

CROSS-REFERENCE TO RELATED APPLICATION

The present application claims priority under 35 U.S.C. 119(a) to Korean Application number 10-2017-0004429 filed on Jan. 11, 2017, which is herein incorporated by reference in its entirety.

BACKGROUND

1. Technical Field

Various embodiments of the present disclosure generally relate to error correction code (ECC) decoders and, more particularly, to ECC decoders sharing logic operations, memory controllers including the ECC decoders, and methods of decoding ECCs.

2. Related Art

Nonvolatile memory devices retain their stored data even when their power supplies are interrupted, and for that reason the nonvolatile memory devices are widely used as data storage in portable electronic systems such as smart phones, digital cameras, and computers. In order to increase data capacity of the nonvolatile memory devices such as NAND-type flash memory devices, multi-level cell (MLC) techniques may be used. Such MLC flash memories may store more than one bit per cell. In addition, advanced fabrication techniques may increase the data capacity by reducing the minimum feature size of patterns constituting memory cells of semiconductor devices. Recently, three-dimensional cell structures (e.g., vertical cell structures) are regarded as the most promising alternative to two-dimensional cell structures because the three-dimensional cell structures can overcome the limitations of the two-dimensional cell structures in increasing the integration density of the NAND-type flash memory devices.

The decrease in the minimum feature size of patterns and the increase in the number of bits stored per cell may lead to degradation of the reliability of the NAND-type flash memory devices. This is because a cell-to-cell interference may occur if a pattern size is reduced and data errors may easily occur if multi-bit data is stored in a single cell using the MLC techniques. Accordingly, an error correction code (ECC) is been used to guarantee the reliability of the semiconductor devices fabricated using the advanced process techniques and the semiconductor devices using the MLC techniques.

In the case of other types of nonvolatile memory devices such as phase change random access memory (PCRAM) devices, magnetoresistive RAM (MRAM) devices, nano floating gate memory (NFGM) devices, resistive RAM (RRAM) devices, and polymer RAM devices, a read margin may be tight due to the nature of cells thereof. Thus, error rates of the PCRAM devices, the MRAM device, the NFGM devices, the RRAM devices, and the polymer RAM devices may be higher than the NAND-type flash memory devices, even if they have a single level cell (SLC) structure. Accordingly, error correction scheme such as the ECC is becoming more essential to the PCRAM devices, the MRAM device, the NFGM devices, the RRAM devices, and the polymer RAM devices.

If the semiconductor devices have a relatively low error rate, a Hamming code may be used to detect and correct the data errors. In contrast, if the semiconductor devices have a relatively high error rate, a Bose-Chaudhuri-Hocquenghem (BCH) code or a Reed-Solomon (RS) code may be used to detect and correct the data errors. A binary BCH code may be designed to have a high code rate, and may be realized using a relatively simple circuit, as compared with the RS code.

An ECC decoding algorithm of the BCH code may include a syndrome operation, an error location polynomial operation, an error location operation, and an error correction operation. Most operations for executing the ECC decoding algorithm may be performed using exclusive OR (XOR) operations and Galois field multiplying operations. Thus, a lot of XOR arithmetic elements and a lot of Galois field multipliers may be required to realize an ECC decoder performing the XOR operations and Galois field multiplying operations, and logic components such as the XOR arithmetic elements and the Galois field multipliers occupy most of the space in the ECC decoder.

SUMMARY

Various embodiments are directed to ECC decoders sharing logic operations, memory controllers including the ECC decoders, and methods of decoding ECCs.

According to an embodiment, an ECC decoder may include a finite state machine (FSM) controller and a shared logic circuit. The FSM controller may generate a first control signal and a second control signal each corresponding to a certain state. The shared logic circuit may include a plurality of shared Galois field (GF) multipliers, a plurality of shared XOR arithmetic elements, and a plurality of shared multiplexers (MUXs), which are used for an operation selected between a syndrome operation, an error location polynomial operation, an error location operation, and an error correction operation, in response to the first and second control signals.

According to an embodiment, there is provided a memory controller coupled between a host and a memory device to control the memory device in response to a command output from the host. The memory controller may include an error correction code (ECC) encoder performing an error correction encoding operation on data to be written into the memory device to generate a codeword including parity bits and an ECC decoder performing an error correction decoding operation on data output from the memory device. The ECC decoder may include a finite state machine (FSM) controller and a shared logic circuit. The FSM controller may generate a first control signal and a second control signal corresponding to a certain state. The shared logic circuit may include a plurality of shared Galois field (GF) multipliers, a plurality of shared XOR arithmetic elements, and a plurality of shared multiplexers (MUXs), which are used for an operation selected between a syndrome operation, an error location polynomial operation, an error location operation, and an error correction operation, in response to the first and second control signals.

According to an embodiment, there is provided a method of decoding ECCs. The method may include providing a shared logic circuit including a plurality of shared Galois field (GF) multipliers, a plurality of shared XOR arithmetic elements and a plurality of shared multiplexers (MUXs). A finite state machine (FSM) controller is provided to generate a first control signal and a second control signal each corresponding to a certain state. The shared logic circuit including the plurality of shared GF multipliers, the plurality of shared XOR arithmetic elements, and the plurality of shared MUXs may be driven to perform an operation selected between a syndrome operation, an error location polynomial operation, an error location operation, and an error correction operation, in response to the first and second control signals.

BRIEF DESCRIPTION OF THE DRAWINGS

Various embodiments of the present disclosure will become more apparent in view of the attached drawings and accompanying detailed description, in which:

FIG. 14 illustrates a reformulated inversionless Berlekamp-Massey (RiBM) algorithm used in an error location polynomial operation;

DETAILED DESCRIPTION

In the following description of the embodiments, it will be understood that the terms "first" and "second" are intended to identify an element, but not used to define only the element itself or to mean a particular sequence. In addition, when an element is referred to as being located "on," "over," "above," "under" or "beneath" another element, it is intended to mean relative position relationship, but not used to limit certain cases that the element directly contacts the other element, or at least one intervening element is present therebetween. Accordingly, the terms such as "on," "over," "above," "under," "beneath," "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
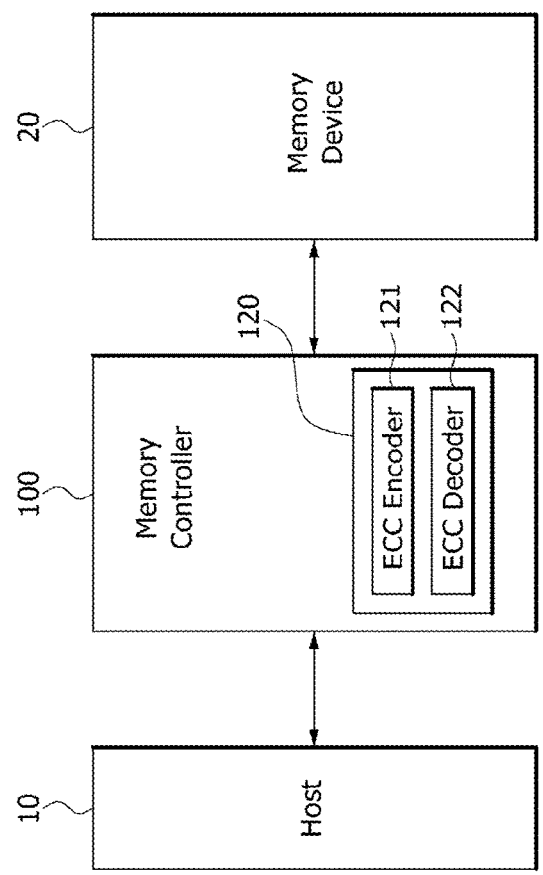
FIG. 1 is a block diagram illustrating an electronic system including a memory controller according to an embodiment of the present disclosure.

FIG. 1 is a block diagram illustrating an electronic system including a memory controller 100 according to an embodiment of the present disclosure. Referring to FIG. 1, the electronic system may include a host 10, a memory device 20, and the memory controller 100 coupled between the host 10 and the memory device 20. The memory controller 100 may receive a command from the host 10 to control various operations (e.g., an erasure operation, a write/program operation, and a read operation) of the memory device 20. The memory controller 100 may include an error correction circuit 120 correcting erroneous bits in data. The error correction circuit 120 may include an ECC encoder 121 and an ECC decoder 122. The ECC encoder 121 may perform an error correction encoding operation on data written into the memory device 20, to generate a codeword including one or more parity bits. The ECC decoder 122 may perform an error correction decoding operation on data output from the memory device 20 to generate an error-corrected codeword. After the parity bits are removed from the error-corrected codeword, the error-corrected codeword without the parity bits may be transmitted to the host 10. The ECC decoder 122 or an interface unit in the memory controller 100 may remove the parity bits from the error-corrected codeword.

Figure 2:
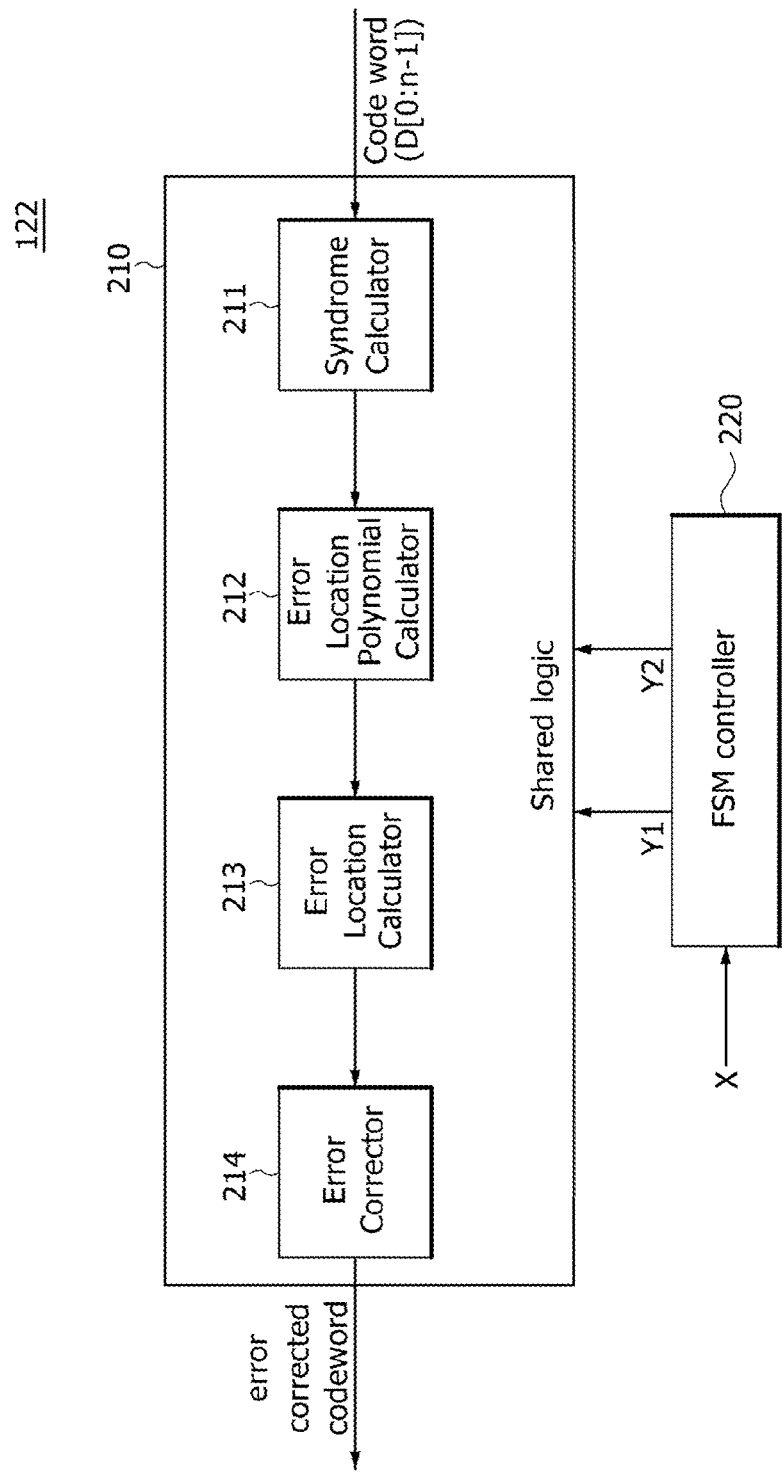
FIG. 2 is a block diagram illustrating an error correction code (ECC) decoder according to an embodiment of the present disclosure.

FIG. 2 is a block diagram illustrating the ECC decoder 122 included in the electronic system of FIG. 1. Referring to FIG. 2, the ECC decoder 122 may apply an ECC decoding algorithm using a BCH code to an "n"-bit codeword D<0: n−1> output from the memory device 20 to generate an error-corrected codeword. In order to generate the error-corrected codeword, the ECC decoder 122 may include a shared logic circuit 210 and a finite state machine (FSM) controller 220. The shared logic circuit 210 may include a syndrome calculator 211, an error location polynomial calculator 212, an error location calculator 213, and an error corrector 214. Although FIG. 1 illustrates an example in which the shared logic circuit 210 includes the syndrome calculator 211, the error location polynomial calculator 212, the error location calculator 213, and the error corrector 214, this is merely an example of a functional configuration of the shared logic circuit 210. In an embodiment, an operation of the shared logic circuit 210 may be performed using constituent elements of the shared logic circuit 210 in common. For example, a syndrome operation, an error location polynomial operation, an error location operation, and an error correction operation of the ECC decoder 122 may be executed by the constituent elements of the shared logic circuit 210. That is, the constituent elements of the shared logic circuit 210 may be used in common in execution of the syndrome operation, the error location polynomial operation, the error location operation, and the error correction operation. These operations of the shared logic circuit 210 may be controlled by a first control signal Y1 and a second control signal Y2 output from the FSM controller 220. The syndrome operation and the error location operation of the shared logic circuit 210 may be executed according to the first control signal Y1. The error location polynomial operation of the shared logic circuit 210 may be executed according to the first and second control signals Y1 and Y2. The error correction operation of the shared logic circuit 210 may be executed according to the second control signal Y2. The FSM controller 220 may generate the first and second control signals Y1 and Y2 in response to an input control signal X.

Figure 3:
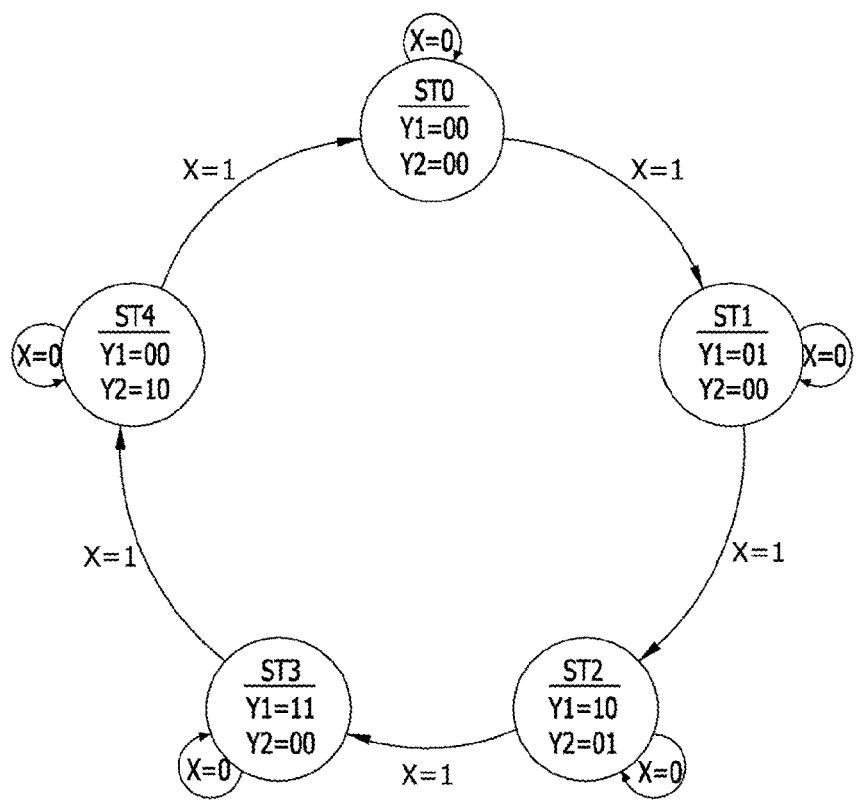
FIG. 3 is a state diagram illustrating an operation of a finite state machine (FSM) controller shown in FIG. 2.

FIG. 3 is a state diagram illustrating an operation of the FSM controller 220 shown in FIG. 2. Referring to FIG. 3, the FSM controller 220 may circularly operate based on a plurality of states. The plurality of states may include a first state ST0, a second state ST1, a third state ST2, a fourth state ST3, and a fifth state ST4. The first state ST0 may be defined as an initialized state. In an embodiment, the FSM controller 220 may output the first control signal Y1 having a logic level combination "00" and the second control signal Y2 having a logic level combination of "00" in the first state ST0. The shared logic circuit 210 may put an ECC decoding operation in a standby state in response to the first and second control signals Y1 and Y2 having a logic level combination "00." If the input control signal X has a certain level, for example, a logic "low" level denoted by "0," the FSM controller 220 may maintain the first state ST0.

If a level of the input control signal X changes from a logic "low(0)" level into a logic "high(1)" level, a state of the FSM controller 220 may change from the first state ST0 into the second state ST1. The second state ST1 may be defined as a syndrome operation state. After the FSM controller 220 enters the second state ST1, the input control signal X may turn into a logic "low(0)" level. While the input control signal X has a logic "low(0)" level after the FSM controller 220 enters the second state ST1, the FSM controller 220 may maintain the second state ST1. While being in the second state ST1, the FSM controller 220 may output the first control signal Y1 having a logic level combination "01" and the second control signal Y2 having a logic level combination "00." The shared logic circuit 210 may perform the syndrome operation in response to the first control signal Y1 having a logic level combination "01" and the second control signal Y2 having a logic level combination "00."

If a logic level of the input control signal X changes from a logic "low(0)" level into a logic "high(1)" level, a state of the FSM controller 220 may change from the second state ST1 into the third state ST2. The third state ST2 may be defined as an error location polynomial operation state. After the FSM controller 220 enters the third state ST2, the input control signal X may turn into a logic "low(0)" level. While the input control signal X has a logic "low(0)" level after the FSM controller 220 enters the third state ST2, the FSM controller 220 may maintain the third state ST2. While being in the third state ST2, the FSM controller 220 may output the first control signal Y1 having a logic level combination "10" and the second control signal Y2 having a logic level combination "01." The shared logic circuit 210 may perform the error location polynomial operation in response to the first control signal Y1 having a logic level combination "10" and the second control signal Y2 having a logic level combination "01."

If a logic level of the input control signal X changes from a logic "low(0)" level into a logic "high(1)" level, a state of the FSM controller 220 may change from the third state ST2 into the fourth state ST3. The fourth state ST3 may be defined as an error location operation state. After the FSM controller 220 enters the fourth state ST3, the input control signal X may turn into a logic "low(0)" level. While the input control signal X has a logic "low(0)" level after the FSM controller 220 enters the fourth state ST3, the FSM controller 220 may maintain the fourth state ST3. While being in the fourth state ST3, the FSM controller 220 may output the first control signal Y1 having a logic level combination "11" and the second control signal Y2 having a logic level combination "00." The shared logic circuit 210 may perform the error location operation in response to the first control signal Y1 having a logic level combination "11" and the second control signal Y2 having a logic level combination "00."

If a level of the input control signal X changes from a logic "low(0)" level into a logic "high(1)" level, a state of the FSM controller 220 may change from the fourth state ST3 into the fifth state ST4. The fifth state ST4 may be defined as an error correction operation state. After the FSM controller 220 enters the fifth state ST4, the input control signal X may turn into a logic "low(0)" level. While the input control signal X has a logic "low(0)" level after the FSM controller 220 enters the fifth state ST4, the FSM controller 220 may maintain the fifth state ST4. While being in the fifth state ST4, the FSM controller 220 may output the first control signal Y1 having a logic level combination "00" and the second control signal Y2 having a logic level combination "10." The shared logic circuit 210 may perform the error correction operation in response to the first control signal Y1 having a logic level combination "00" and the second control signal Y2 having a logic level combination "10." If the input control signal X having a logic "high(1)" level is input to the FSM controller 220 while the FSM controller 220 maintains the fifth state ST4, a state of the FSM controller 220 may change from the fifth state ST4 into the first state ST0.

Figure 4:
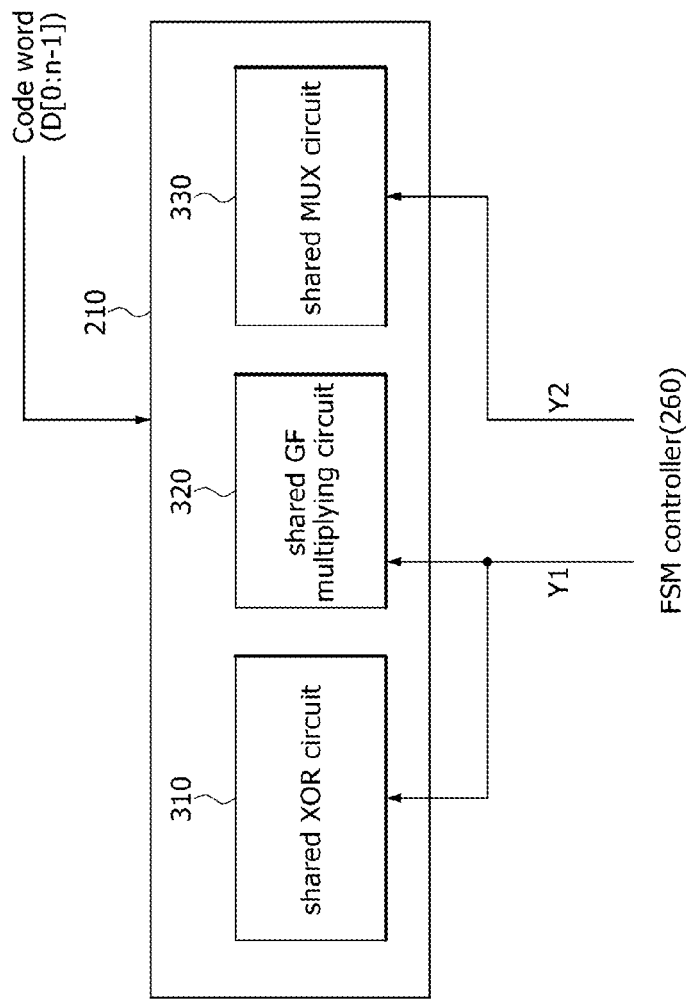
FIG. 4 is a block diagram illustrating a shared logic circuit included in the ECC decoder of FIG. 2.

FIG. 4 is a block diagram illustrating the shared logic circuit 210 included in the ECC decoder 122 of FIG. 2. Referring to FIG. 4, the shared logic circuit 210 in accordance with and embodiment may include a shared XOR circuit 310, a shared Galois field (GF) multiplying circuit 320, and a shared multiplexing circuit 330. The shared XOR circuit 310 may include a plurality of XOR arithmetic elements. The shared GF multiplying circuit 320 may include a plurality of shared GF multipliers. The shared multiplexing circuit 330 may include a plurality of shared multiplexing elements. The first control signal Y1 output from the FSM controller 220 may be input to the XOR arithmetic elements in the shared XOR circuit 310 and to the shared GF multipliers in the shared GF multiplying circuit 320. The XOR arithmetic elements and the shared GF multipliers may be used for an operation selected between the syndrome operation, the error location polynomial operation, and the error location operation, according to the first control signal Y1. The second control signal Y2 output from the FSM controller 220 may be input to the shared multiplexing elements in the shared multiplexing circuit 330. The shared multiplexing elements may be used for an operation selected between the error location polynomial operation and the error correction operation, according to the second control signal Y2.

Figure 5:
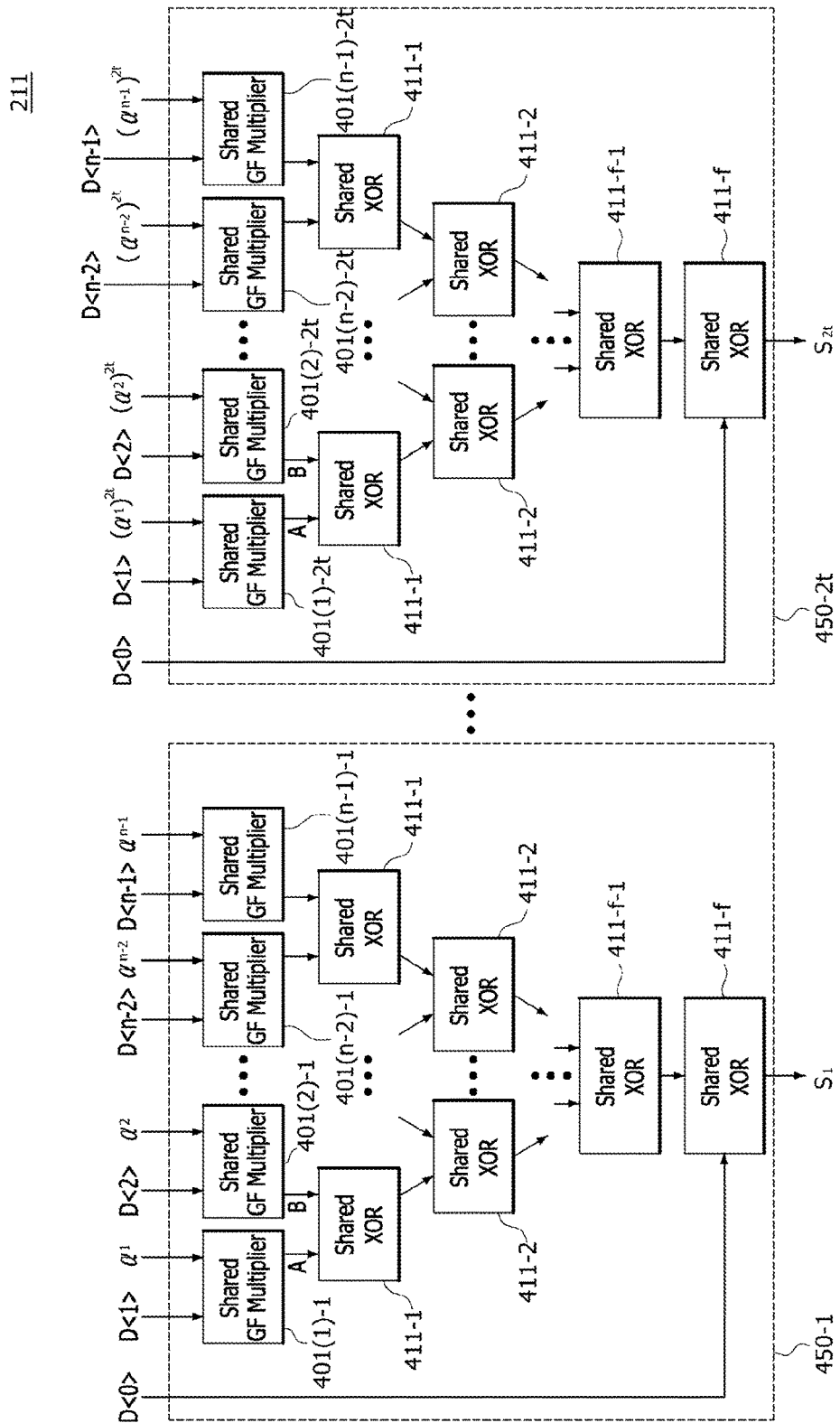
FIG. 5 is a block diagram illustrating a logical configuration of a syndrome calculator that is controlled by constituent elements of the shared logic circuit of FIG. 4 to execute a syndrome operation.

FIG. 5 is a block diagram illustrating a logical configuration of the syndrome calculator 211, which is controlled by constituent elements of the shared logic circuit 210 of FIG. 4 to execute the syndrome operation. Referring to FIG. 5, a number of syndrome calculating blocks in the syndrome calculator 211 may be "2t." That is, the syndrome calculator 211 may include first to $(2t)^{th}$ syndrome calculating blocks 450-1, . . . , and 450-2t. A number of shared GF multipliers in the first syndrome calculating block 450-1 may be "(n−1)." That is, the first syndrome calculating block 450-1 may include first to $(n-1)^{th}$ shared GF multipliers 401(1)-1, 401(2)-1, . . . , 401(n−2)-1 and 401(n−1)-1. Each of the second to $(2t)^{th}$ syndrome calculating blocks 450-2, . . . , and 450-2t may have substantially the same configuration as the first syndrome calculating block 450-1. In such a case, since each of the first to $(2t)^{th}$ syndrome calculating blocks 450-1, . . . , and 450-2t includes "(n−1)" shared GF multipliers, the number of all of the shared GF multipliers used in the syndrome operation may be expressed by an equation of "2t×(n−1)" (where "t" denotes the maximum number of error correctable bits). In an embodiment, if the maximum number "t" of error correctable bits is two and the number "n" of bits included in the codeword is thirty one, the number of the shared GF multipliers used in the syndrome calculator 211 may be one hundred and twenty.

Each of the first to $(n-1)^{th}$ shared GF multipliers 401(1)-1, 401(2)-1, . . . , 401(n−2)-1 and 401(n−1)-1 included in the first syndrome calculating block 450-1 may receive any one among bit data D<1>, D<2>, . . . , D<n−2> and D<n−1> other than a least significant bit (LSB) D<0> in the "n"-bit codeword D<0:n−1>, and may receive any one among GF primitive elements $\alpha^1, \alpha^2, \ldots, \alpha^{(n-2)}$ and $\alpha^{(n-1)}$. In such a case, the exponents 1, 2, . . . , (n−2) and (n−1) of the GF primitive elements input to the first syndrome calculating block 450-1 may be equal to the bit numbers 1, 2, . . . , (n−2) and (n−1) of the codeword D<0:n−1>, respectively. For example, the second bit D<1> of the codeword D<0:n−1> and the GF primitive element $\alpha^1$ may be input to the first shared GF multiplier 401(1)-1, and the third bit D<2> of the codeword D<0:n−1> and the GF primitive element $\alpha^2$ may be input to the second shared GF multiplier 401(2)-1. Similarly, the $(n-1)^{th}$ bit D<n−2> of the codeword D<0:n−1> and the GF primitive element $\alpha^{(n-2)}$ may be input to the $(n-2)^{th}$ shared GF multiplier 401(n−2)-1, and the $n^{th}$ bit datum D<n−1> of the codeword D<0:n−1> and the GF primitive element $\alpha^{(n-1)}$ may be input to the $(n-1)^{th}$ shared GF multiplier 401(n−1)-1.

Each of first to $(n-1)^{th}$ shared GF multipliers 401(1)-2t, 401(2)-2t, . . . , 401(n−2)-2t and 401(n−1)-2t included in the $(2t)^{th}$ syndrome calculating block 450-2t may receive any one among the bit data D<1>, D<2>, . . . , D<n−2> and D<n−1> other than the LSB D<0> in the "n"-bit codeword D<0:n−1>, and may receive any one among elements $(\alpha^1)^{2t}$, $(\alpha^2)^{2t}, \ldots, (\alpha^{(n-2)})^{2t}$ and $(\alpha^{(n-1)})^{2t}$ corresponding to the GF primitive elements ($\alpha^1, \alpha^2, \ldots, \alpha^{(n-2)}$ and $\alpha^{(n-1)}$) to the $2t^{th}$. In such a case, the exponents 1, 2, . . . , (n−2) and (n−1) of the GF primitive elements input to the $(2t)^{th}$ syndrome calculating block 450-2t may be equal to the bit numbers 1, 2, . . . , (n−2) and (n−1) of the codeword D<0:n−1>, respectively. For example, the second bit D<1> of the codeword D<0:n−1> and the GF primitive element $(\alpha^1)^{2t}$ may be input to the first shared GF multiplier 401(1)-2t, and the third bit D<2> of the codeword D<0:n−1> and the GF primitive element $(\alpha^2)^{2t}$ may be input to the second shared GF multiplier 401(2)-2t. Similarly, the $(n-1)^{th}$ bit D<n−2> of the codeword D<0:n−1> and the GF primitive element $(\alpha^{(n-2)})^{2t}$ may be input to the $(n-2)^{th}$ shared GF multiplier 401(n−2)-2t, and the $n^{th}$ bit D<n−1> of the codeword D<0:n−1> and the GF primitive element $(\alpha^{(n-1)})^{2t}$ may be input to the $(n-1)^{th}$ shared GF multiplier 401(n−1)-2t.

Each of the first to $(2t)^{th}$ syndrome calculating blocks 450-1, . . . , and 450-2t may include a plurality of shared XOR arithmetic elements 411-1, 411-2, . . . , and 411-f, which are hierarchically arranged from a first level corresponding to the highest-order level to a $f^{th}$ level corresponding to the lowest-order level. The shared XOR arithmetic elements 411-1 may be at the first level, and the shared XOR arithmetic element 411-f may be at the $f^{th}$ level. The first to $(2t)^{th}$ syndrome calculating blocks 450-1, 450-2, . . . , and 450-2t have substantially the same configuration as those described above. Thus, each of the second to $(2t)^{th}$ syndrome calculating blocks 450-2, . . . , and 450-2t may also include a plurality of shared XOR arithmetic elements 411-1, 411-2, . . . , and 411-f, which are hierarchically arranged from a first level corresponding to the highest-order level to the $f^{th}$ level corresponding to the lowest-order level. Accordingly, a configuration and an operation of only the shared XOR arithmetic elements 411-1, 411-2, . . . , and 411-f included in the first syndrome calculating block 450-1 will be described in detail hereinafter.

Each of the shared XOR arithmetic elements 411-1 at the first level may perform an XOR operation on two output signals output from two of the first to $(n-1)^{th}$ shared GF multipliers 401(1)-1, . . . , and 401(n−1)-1, and may output the result of the XOR operation. For example, the first shared XOR arithmetic elements 411-1 at the first level (e.g., the leftmost shared XOR arithmetic elements 411-1 in the drawing) may receive output signals A and B of the first and second shared GF multipliers 401(1)-1 and 401(2)-1, and may perform an XOR operation on the output signals A and B to output the result of the XOR operation. Since one of the shared XOR arithmetic elements 411-1 receives output signals of two of the first to $(n-1)^{th}$ shared GF multipliers 401(1)-1, 401(2)-1, . . . , 401(n−2)-1 and 401(n−1)-1, the rightmost shared XOR arithmetic elements 411-1 at the first level in the drawing may receive an output signal of the $(n-1)^{th}$ shared GF multiplier 401(n−1)-1 receiving the $n^{th}$ bit D<n−1> (e.g., a most significant bit [MSB]) of the codeword D<0:n−1> and an output signal of the $(n-2)^{th}$ shared GF multiplier 401(n−2)-1 receiving the $(n-1)^{th}$ bit D<n−2> of the codeword D<0:n−1>. The number of the shared XOR arithmetic elements 411-1 at the first level may be expressed by an equation of "(n−1)/2" (where "n" is the number of bits in the codeword D<0:n−1>). In an embodiment, if the "n" is thirty one, each of the syndrome calculating blocks 450-1, . . . and 450-2t may have fifteen shared XOR arithmetic elements 411-1 at the first level.

Each of the shared XOR arithmetic elements 411-2 at the second level may perform an XOR operation on two output signals output from two of the shared XOR arithmetic elements 411-1 at the first level, and may output the result of the XOR operation. The number of the shared XOR arithmetic elements 411-2 at the second level may be expressed by an equation of "z1/2" if the number of the shared XOR arithmetic elements 411-1 at the first level is an even number "z1." If the number of the shared XOR arithmetic elements 411-1 at the first level is an odd number "z2," the number of the shared XOR arithmetic elements 411-2 at the second level may be expressed by an equation of "(z2−1)/2." In such a case, none of the shared XOR arithmetic elements 411-2 at the second level receives an output signal of one (e.g., a rightmost XOR arithmetic element) of the shared XOR arithmetic elements 411-1 at the first level. In an embodiment, if the "n" is thirty one, each of the syndrome calculating blocks 450-1, . . . and 450-2t may have seven second shared XOR arithmetic elements 411-2 at the second level ((15−1)/2=7) because the number of the first shared XOR arithmetic elements 411-1 at the first level is fifteen, which is an odd number.

Configurations and operations of the XOR arithmetic elements at a third level and a fourth level may be the same as those described above. Only a single shared XOR arithmetic element 411-(f−1) may be at the (f−1)$^{th}$ level, and only a single shared XOR arithmetic element 411-f may also be at the f$^{th}$ level corresponding to the last level. The (f−1)$^{th}$ shared XOR arithmetic element 411-(f−1) may perform an XOR operation on output signals of the XOR arithmetic elements at a previous level (e.g., (f−2)$^{th}$ level) of the (f−1)$^{th}$ level, and may output the result of the XOR operation. The f$^{th}$ shared XOR arithmetic element 411-f may perform an XOR operation on an output signal of the (f−1)$^{th}$ shared XOR arithmetic element 411-(f−1) and the LSB D<0> of the codeword D<0:n−1>, and may output the result of the XOR operation as a first syndrome $S_1$. Similarly, in the (2t)$^{th}$ syndrome calculating block 450-2t, the f$^{th}$ shared XOR arithmetic element 411-f may perform an XOR operation on an output signal of the (f−1)$^{th}$ shared XOR arithmetic element 411-(f−1) and the LSB D<0> of the codeword D<0:n−1>, and may output the result of the XOR operation as a (2t)$^{th}$ syndrome $S_{2t}$.

Since each of the first to (2t)$^{th}$ syndrome calculating blocks 450-1, 450-2, . . . , and 450-2t includes "(n−1)" shared XOR arithmetic elements, the number of all of the shared XOR arithmetic elements used in the syndrome operation may be expressed by an equation of "2t(n−1)." In an embodiment, if the maximum number "t" of error correctable bits is two, and if the "n" (i.e., the number of bits included in the codeword) is thirty one, the number of all of the shared XOR arithmetic elements used in the syndrome calculator 211 may be one hundred and twenty (2×2×30=120). In an embodiment, if the maximum number "t" of error correctable bits is two, and if the "n" is thirty, the number of all of the shared XOR arithmetic elements used in the syndrome calculator 211 may be one hundred and sixteen (2×2×29=116).

Figure 6:
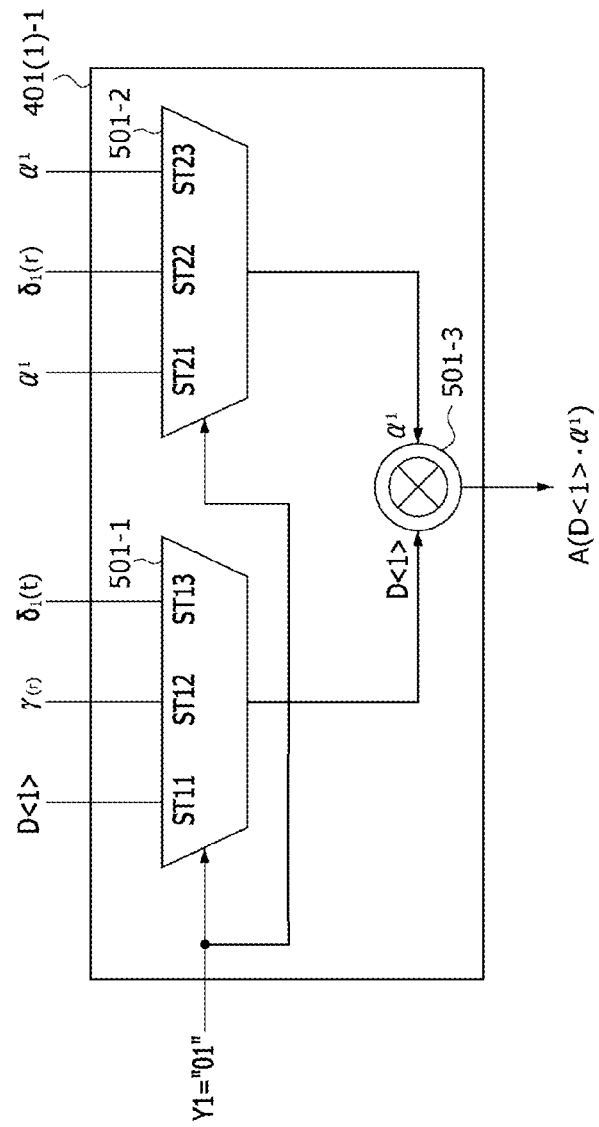
FIG. 6 is a circuit diagram illustrating an example of a first Galois field multiplier included in a first syndrome calculating block of FIG. 5.
Figure 7:
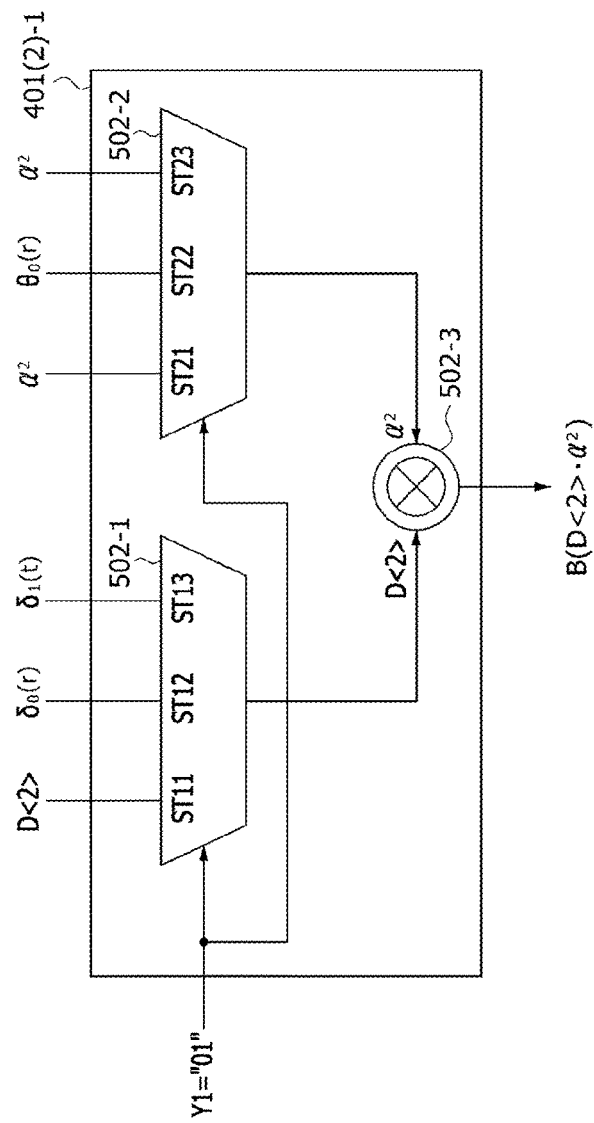
FIG. 7 is a circuit diagram illustrating an example of a second Galois field multiplier included in the first syndrome calculating block of FIG. 5.

FIG. 6 is a circuit diagram illustrating an example of the first shared GF multiplier 401(1)-1 included in the first syndrome calculating block 450-1 of FIG. 5, and FIG. 7 is a circuit diagram illustrating an example of the second shared GF multiplier 401(2)-1 included in the first syndrome calculating block 450-1 of FIG. 5. Each of the first shared GF multiplier 401(1)-1 and the second shared GF multiplier 401(2)-1 included in the first syndrome calculating block 450-1 may be one of the plurality of shared GF multipliers constituting the shared GF multiplying circuit 320 of the shared logic circuit 210.

First, referring to FIG. 6, the first shared GF multiplier 401(1)-1 of the first syndrome calculating block 450-1 may include a first MUX 501-1, a second MUX 501-2, and a GF multiplier 501-3. The first MUX 501-1 may have an input terminal, a first state input terminal ST11, a second state input terminal ST12, and a third state input terminal ST13. The first MUX 501-1 may receive the first control signal Y1 from the FSM controller 220 through the input terminal. The first MUX 501-1 may receive the second bit D<1> of the codeword D<0:n−1> necessary to the syndrome operation through the first state input terminal ST11. The first MUX 501-1 may receive a control signal γ(r) necessary to the error location polynomial operation through the second state input terminal ST12. The first MUX 501-1 may receive an error location polynomial coefficient $\delta_1$(t), which will be used for the error location operation, through the third state input terminal ST13. The first MUX 501-1 may output any one of the second bit D<1> of the codeword D<0:n−1>, the control signal γ(r), and the error location polynomial coefficient $\delta_1$(t), according to the first control signal Y1.

The second MUX 501-2 may have an input terminal, a first state input terminal ST21, a second state input terminal ST22, and a third state input terminal ST23. The second MUX 501-2 may receive the first control signal Y1 from the FSM controller 220 through the input terminal. The second MUX 501-2 may receive the GF primitive element $\alpha^1$ necessary to the syndrome operation through the first state input terminal ST21. The second MUX 501-2 may receive an error location polynomial coefficient $\delta_1$(r), which will be used for the error location polynomial operation, through the second state input terminal ST22. The second MUX 501-2 may receive the GF primitive element $\alpha^1$, which will be used for the error location operation, through the third state input terminal ST23. The second MUX 501-2 may output one of the GF primitive element $\alpha^1$ and the error location polynomial coefficient $\delta_1$(r) according to the first control signal Y1.

If the first control signal Y1 output from the FSM controller 220 has a logic level combination "01," both of the first and second MUXs 501-1 and 501-2 may operate in a syndrome operation mode. That is, the first MUX 501-1 may output the second bit D<1> of the codeword D<0:n−1> input through the first state input terminal ST11 in response to the first control signal Y1 having a logic level combination "01," and the second MUX 501-2 may output the GF primitive element $\alpha^1$ input through the first state input terminal ST21 in response to the first control signal Y1 having a logic level combination "01." The second bit D<1> of the codeword D<0:n−1> output from the first MUX 501-1 and the GF primitive element $\alpha^1$ output from the second MUX 501-2 may be input to the GF multiplier 501-3. The GF multiplier 501-3 may perform a GF multiplying operation on the second bit D<1> of the codeword D<0:n−1> and the GF primitive element $\alpha^1$ to generate the output signal A (D<1>·$\alpha^1$).

Next, referring to FIG. 7, the second shared GF multiplier 401(2)-1 of the first syndrome calculating block 450-1 may include a first MUX 502-1, a second MUX 502-2, and a GF multiplier 502-3. The first MUX 502-1 may have an input terminal, a first state input terminal ST11, a second state input terminal ST12, and a third state input terminal ST13. The first MUX 502-1 may receive the first control signal Y1 from the FSM controller 220 through the input terminal. The first MUX 502-1 may receive the third bit D<2> of the codeword D<0:n−1>, which will be used for the syndrome operation, through the first state input terminal ST11. The first MUX 502-1 may receive an error location polynomial coefficient $\delta_0(r)$, which will be used for the error location polynomial operation, through the second state input terminal ST12. The first MUX 502-1 may receive an error location polynomial coefficient $\delta_1(t)$, which will be used for the error location operation, through the third state input terminal ST13. The first MUX 502-1 may output one of the third bit D<2> of the codeword D<0:n−1>, the error location polynomial coefficient $\delta_0(r)$, and the error location polynomial coefficient $\delta_1(t)$, according to the first control signal Y1.

The second MUX 502-2 may have an input terminal, a first state input terminal ST21, a second state input terminal ST22, and a third state input terminal ST23. The second MUX 502-2 may receive the first control signal Y1 from the FSM controller 220 through the input terminal. The second MUX 502-2 may receive the GF primitive element $\alpha^2$, which will be used for the syndrome operation, through the first state input terminal ST21. The second MUX 502-2 may receive a control signal $\theta_0(r)$, which will be used for the error location polynomial operation, through the second state input terminal ST22. The second MUX 502-2 may receive the GF primitive element $\alpha^2$, which will be used for the error location operation, through the third state input terminal ST23. The second MUX 502-2 may output one of the GF primitive element $\alpha^2$ and the control signal $\theta_0(r)$ according to the first control signal Y1.

As illustrated in FIG. 7, if the first control signal Y1 output from the FSM controller 220 has a logic level combination "01," both of the first and second MUXs 502-1 and 502-2 may operate in a syndrome operation mode. That is, the first MUX 502-1 may output the third bit D<2> of the codeword D<0:n−1> input through the first state input terminal ST11 in response to the first control signal Y1 having a logic level combination "01," and the second MUX 502-2 may output the GF primitive element $\alpha^2$ input through the first state input terminal ST21 in response to the first control signal Y1 having a logic level combination "01." The third bit D<2> of the codeword D<0:n−1> output from the first MUX 502-1 and the GF primitive element $\alpha^2$ output from the second MUX 502-2 may be input to the GF multiplier 502-3. The GF multiplier 502-3 may perform a GF multiplying operation on the third bit D<2> of the codeword D<0:n−1> and the GF primitive element $\alpha^2$ to generate the output signal B (D<1>·$\alpha^2$).

Each of the remaining shared GF multipliers 401(3)-1, ..., 401(n−2)-1, 401(n−1)-1, ..., 401(1)-2t, 401(2)-2t, ..., 401(n−2)-2t and 401(n−1)-2t included in the syndrome calculator 211 may have the same or substantially the same configuration as the first shared GF multiplier 401(1)-1 illustrated in FIG. 6 or the second shared GF multiplier 401(2)-1 illustrated in FIG. 7, except the input of the codeword and the GF primitive element input to the first state input terminals ST11 and ST12.

If the number of bits included in the codeword D<0:n−1> is "n" and the bits of the codeword D<0:n−1> are $r_0$, $r_1$, $r_2$, ..., $r_{n-2}$ and $r_{n-1}$, syndromes Si may be calculated by the following equation 1.

$$Si = r_0 + r_1\alpha^i + r_2(\alpha^2)^i + r_3(\alpha^3)^i + \ldots + r_{n-1}(\alpha^{(n-1)})^i \quad \text{(Equation 1)}$$

In the equation 1, a variable number "i"=1, 2, ... or 2t−1, and equation, and "t" denotes the maximum number of error-correctable bits.

If the variable number "i" in the syndrome equation 1 is one, the shared GF multipliers 401(1)-1, 401(2)-1, ..., 401(n−2)-1 and 401(n−1)-1 in the first syndrome calculating block 450-1 of the syndrome calculator 211 may calculate and output values of $r_1\alpha^1$, $r_2\alpha^2$, ..., $r_{n-2}\alpha^{n-2}$ and $r_{n-1}\alpha^{n-1}$, respectively. Similarly, if the variable "i" in the above syndrome equation 1 is "2t," the shared GF multipliers 401(1)-2t, 401(2)-2t, ..., 401(n−2)-2t and 401(n−1)-2t in the (2t)$^{th}$ syndrome calculating block 450-2t of the syndrome calculator 211 may calculate and output values of $r_1(\alpha^1)^{2t}$, $r_2(\alpha^2)^{2t}$, ..., $r_{n-2}(\alpha^{n-2})^{2t}$ and $r_{n-1}(\alpha^{n-1})^{2t}$, respectively.

Figure 8:
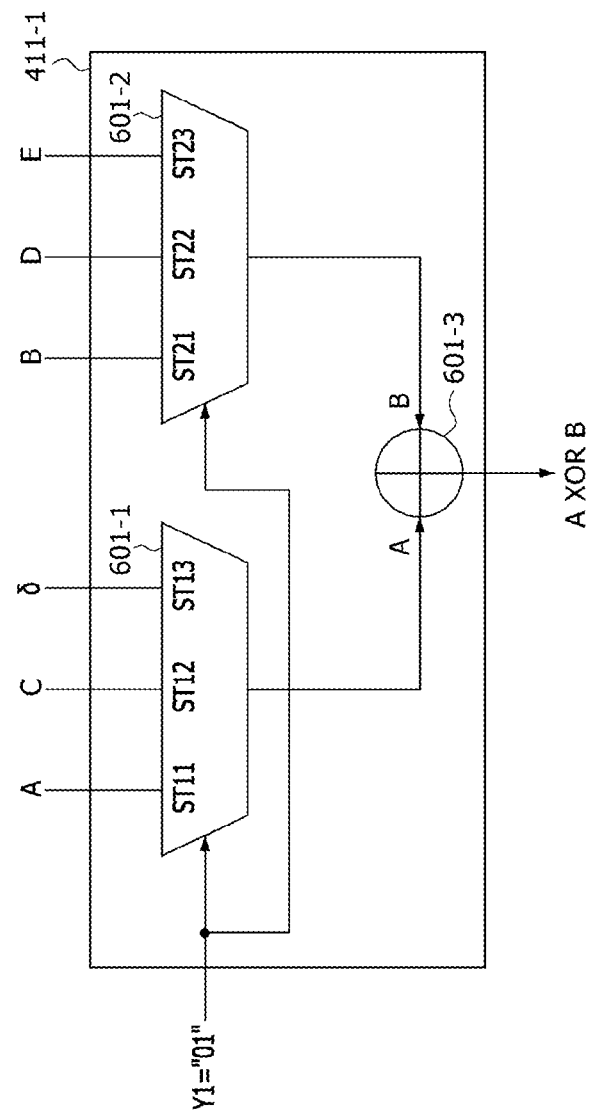
FIG. 8 is a circuit diagram illustrating an example of a first shared XOR arithmetic element in a first level of the first syndrome calculating block of FIG. 5.

FIG. 8 is a circuit diagram illustrating an example of the first shared XOR arithmetic element 411-1 at the first level of the first syndrome calculating block 450-1 of FIG. 5. Each of the first shared XOR arithmetic elements 411-1 at the first level of the first syndrome calculating block 450-1 may be one of the plurality of shared XOR arithmetic elements constituting the shared XOR circuit 310 of the shared logic circuit 210. Referring to FIG. 8, each of the first shared XOR arithmetic elements 411-1 at the first level of the first syndrome calculating block 450-1 may include a first MUX 601-1, a second MUX 601-2, and an XOR arithmetic element 601-3. The first MUX 601-1 may have an input terminal, a first state input terminal ST11, a second state input terminal ST12, and a third state input terminal ST13. The first MUX 601-1 may receive the first control signal Y1 from the FSM controller 220 through the input terminal. The first MUX 601-1 may receive the output signal A of the first shared GF multiplier 401(1)-1 through the first state input terminal ST11. The first MUX 601-1 may receive an output signal C of the shared GF multiplier through the second state input terminal ST12 in an error location polynomial operation mode. The first MUX 601-1 may receive data $\delta$, which will be used for the error location operation, through the third state input terminal ST13. The first MUX 601-1 may output one of the output signal A of the first shared GF multiplier 401(1)-1, the output signal C of the shared GF multiplier, and the data $\delta$ necessary to the error location operation, according to the first control signal Y1.

The second MUX 601-2 may have an input terminal, a first state input terminal ST21, a second state input terminal ST22, and a third state input terminal ST23. The second MUX 601-2 may receive the first control signal Y1 from the FSM controller 220 through the input terminal. The second MUX 601-2 may receive an output signal B of the second shared GF multiplier 401(2)-1 through the first state input terminal ST21. The second MUX 601-2 may receive an output signal D of the shared GF multiplier through the second state input terminal ST22 in the error location polynomial operation mode. The second MUX 601-2 may receive an output signal E of the shared GF multiplier through the third state input terminal ST23 during an error location operation. The second MUX 601-2 may output one of the output signals B, D, and E according to the first control signal Y1.

As illustrated in FIG. 8, if the first control signal Y1 output from the FSM controller 220 has a logic level combination "01," both of the first and second MUXs 601-1 and 601-2 may operate in a syndrome operation mode. That is, the first MUX 601-1 may output the output signal A of the first shared GF multiplier 401(1)-1 input through the first state input terminal ST11 in response to the first control signal Y1 having a logic level combination "01," and the second MUX 601-2 may output the output signal B of the second shared GF multiplier 401(2)-1 input through the first state input terminal ST21 in response to the first control signal Y1 having a logic level combination "01." The output signal A of the first shared GF multiplier 401(1)-1 output from the first MUX 601-1 and the output signal B of the second shared GF multiplier 401(2)-1 output from the second MUX 601-2 may be input to the XOR arithmetic element 601-3. The XOR arithmetic element 601-3 may perform an XOR operation on the output signal A and the output signal B to output the result of the XOR operation as an output signal A XOR B. According to the syndrome equation 1, the first shared XOR arithmetic elements 411-1 (e.g., the leftmost shared XOR arithmetic elements 411-1 in the drawing) at the first level of the of the first syndrome calculating block 450-1 of FIG. 5 may output data having a value of "$(r_1\alpha^1+r_2\alpha^2)$" (where the sign "+" means an XOR operation).

Each of the remaining shared XOR arithmetic elements may have the same configuration as the first shared XOR arithmetic elements 411-1 except the data input to the first state input terminals ST11 of the first MUXs 601-1 and the first state input terminals ST21 of the second MUXs 601-2. If the variable number "i" in the syndrome equation 1 is one, the shared XOR arithmetic element 411-$f$ at the $f^{th}$ level corresponding to the last level of the first syndrome calculating block 450-1 of FIG. 5 may output the first syndrome $S_1$ having a value obtained by using an equation of "$S_1=r(\alpha^1)=r_0+r_1\alpha^1+r_2\alpha^2+\ldots+r_{n-2}(\alpha^{n-2})^{2t}+r_{n-1}(\alpha^{n-1})^{2t}$" which is based on the syndrome equation 1. Similarly, if the variable number "i" in the syndrome equation 1 is "2t," the shared XOR arithmetic element 411-$f$ at the $f^{th}$ level corresponding to the last level of the $(2t)^{th}$ syndrome calculating block 450-2$t$ of FIG. 5 may output the $(2t)^{th}$ syndrome $S_{2t}$ having a value obtained by using an equation of "$S_{2t}=r_0+r_1(\alpha^1)^{2t}+r_2(\alpha^2)^{2t}+\ldots+r_{n-2}(\alpha^{n-2})^{2t}+r_{n-1}(\alpha^{n-1})^{2t}$" which is based on the syndrome equation 1.

Figure 9:
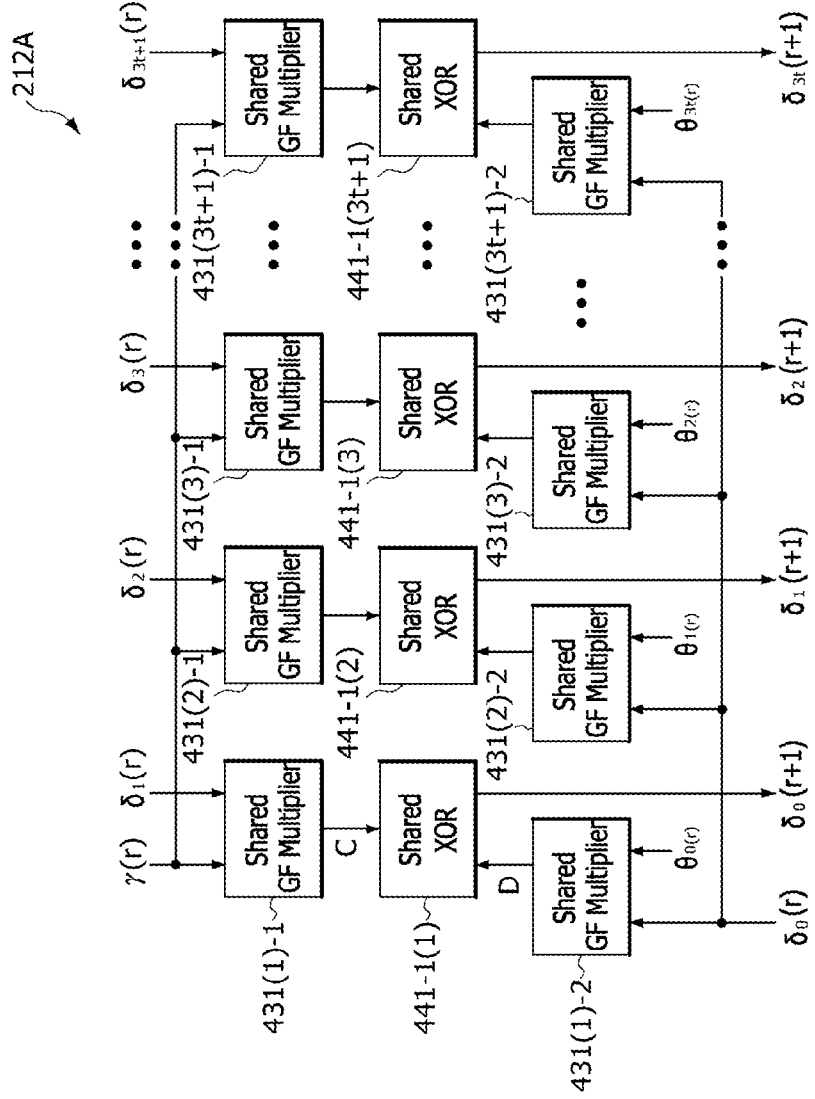
FIGS. 9 and 10 are block diagrams illustrating logical configurations of a first error location polynomial calculator and a second error location polynomial calculator constituting an error location polynomial calculator that is controlled by constituent elements of the shared logic circuit of FIG. 4 to execute an error location polynomial operation, respectively.
Figure 10:
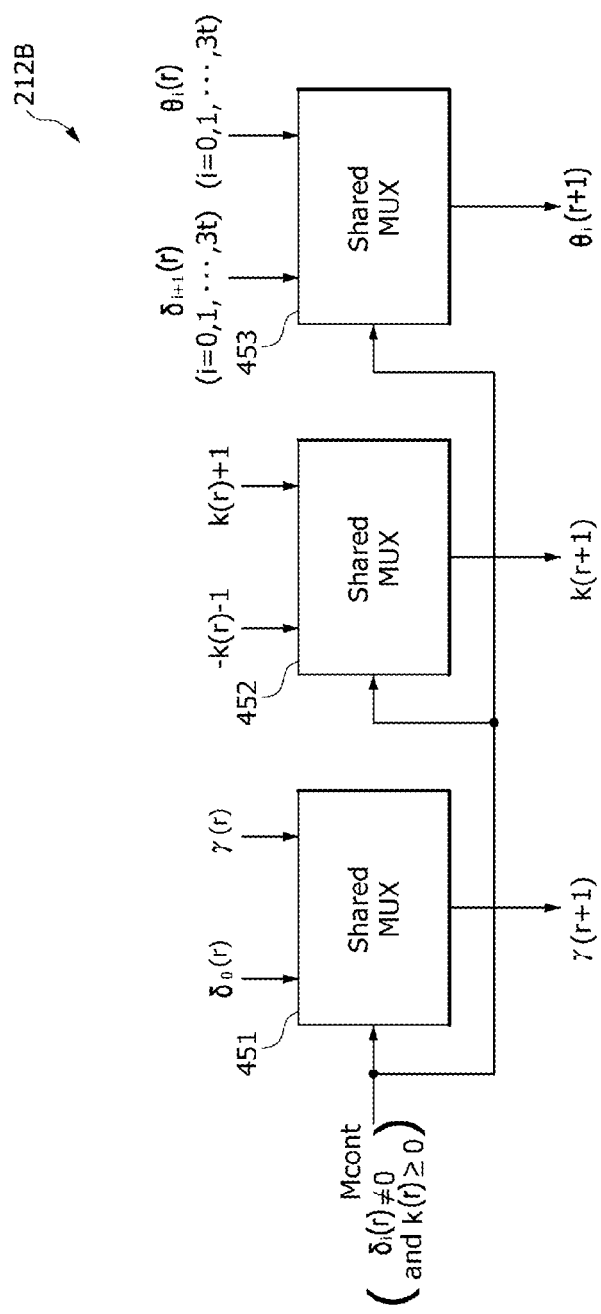

FIGS. 9 and 10 are block diagrams illustrating a logical configuration of the error location polynomial calculator 212, which is controlled by constituent elements of the shared logic circuit 210 of FIG. 4 to execute an error location polynomial operation. The error location polynomial calculator 212 may calculate and output error location polynomial coefficients to which the BM algorithm is applied, using the syndromes calculated by the syndrome calculator 211. The error location polynomial coefficients may be calculated using a reformulated inversionless Berlekamp-Massey (RiBM) algorithm or a simplified inversionless Berlekamp-Massey (SiBM) algorithm. The present embodiment will be described based on an example to which the RiBM algorithm is applied. However, the present disclosure is not limited to the example to which the RiBM algorithm is applied. That is, the error location polynomial coefficients may be calculated using the SiBM algorithm. Referring to FIGS. 9 and 10, the error location polynomial calculator 212 may include a first error location polynomial calculator 212A and a second error location polynomial calculator 212B.

First, as illustrated in FIG. 9, the first error location polynomial calculator 212A may include "3t+1" shared GF multipliers 431(1)-1, 431(2)-1, 431(3)-1, . . . , and 431(3t+1)-1 of a first group as well as "3t+1" shared GF multipliers 431(1)-2, 431(2)-2, 431(3)-2, . . . , and 431(3t+1)-2 of a second group. Thus, the number of the shared GF multipliers used in the error location polynomial operation may be "2×(3t+1)." If the number "n" of bits included in the codeword D<0:n−1> is equal to or greater than five, the number of shared GF multipliers used in the error location polynomial operation may be less than the number of shared GF multipliers used in the syndrome operation. Thus, in such a case, some of the shared GF multipliers used in the syndrome operation may also be used in the error location polynomial operation. Accordingly, no additional shared GF multipliers may be required to perform the error location polynomial operation. In an embodiment, the shared GF multipliers 431(1)-1, 431(2)-1, 431(3)-1, . . . , and 431(3t+1)-1 belonging to the first group as well as the shared GF multipliers 431(1)-2, 431(2)-2, 431(3)-2, . . . , and 431(3t+1)-2 belonging to the second group may correspond to some of the shared GF multipliers included in the first syndrome calculating block 450-1 of the syndrome calculator 211 shown in FIG. 5. In an embodiment, the shared GF multipliers 431(1)-1, 431(2)-1, 431(3)-1, . . . , and 431(3t+1)-1 belonging to the first group may correspond to some of the shared GF multipliers included in the first syndrome calculating block 450-1 of the syndrome calculator 211 shown in FIG. 5, and the shared GF multipliers 431(1)-2, 431(2)-2, 431(3)-2, . . . , and 431(3t+1)-2 belonging to the second group may correspond to some of the shared GF multipliers included in the $(2t)^{th}$ syndrome calculating block 450-2$t$ of the syndrome calculator 211 shown in FIG. 5.

The shared GF multipliers 431(1)-1, 431(2)-1, 431(3)-1, . . . , and 431(3t+1)-1 belonging to the first group may receive in common a control signal $\gamma(r)$ (where "r" is 0, 1, . . . or 2t−1), which will be used for the error location polynomial operation, and the shared GF multipliers 431(1)-1, 431(2)-1, 431(3)-1, . . . , and 431(3t+1)-1 belonging to the first group may also receive the error location polynomial coefficients $\delta_1(r), \delta_2(r), \delta_3(r), \ldots, \delta_{3t+1}(r)$ (where "r" is 0, 1, . . . or 2t−1), respectively. The first shared GF multiplier 431(1)-1 among the first group of the shared GF multipliers 431(1)-1, 431(2)-1, 431(3)-1, . . . , and 431(3t+1)-1 may perform a GF multiplying operation on the control signal $\gamma(r)$ and the error location polynomial coefficient $\iota_1(r)$ (where "r" is 0, 1, . . . or 2t−1) to output the result of the GF multiplying operation. The second shared GF multiplier 431(2)-1 among the first group of the shared GF multipliers 431(1)-1, 431(2)-1, 431(3)-1, . . . , and 431(3t+1)-1 may perform a GF multiplying operation on the control signal $\gamma(r)$ and the error location polynomial coefficient $\delta_2(r)$ (where "r" is 0, 1, . . . or 2t−1) to output the result of the GF multiplying operation. The third shared GF multiplier 431(3)-1 among the first group of the shared GF multipliers 431(1)-1, 431(2)-1, 431(3)-1, . . . , and 431(3t+1)-1 may perform a GF multiplying operation on the control signal $\gamma(r)$ and the error location polynomial coefficient $\delta_3(r)$ (where "r" is 0, 1, . . . or 2t−1) to output the result of the GF multiplying operation. The $(3t+1)^{th}$ shared GF multiplier 431(3t+1)-1 among the first group of the shared GF multipliers 431(1)-1, 431(2)-1, 431(3)-1, . . . , and 431(3t+1)-1 may perform a GF multiplying operation on the control signal $\gamma(r)$ and the error location polynomial coefficient $\delta_{3t+1}(r)$ (where "r" is 0, 1, . . . or 2t−1) to output the result of the GF multiplying operation.

The second group of the shared GF multipliers 431(1)-2, 431(2)-2, 431(3)-2, . . . , and 431(3t+1)-2 may receive an error location polynomial coefficient $\delta_0(r)$ (where, r=0, 1, . . . or 2t−1) in common, and the second group of the shared GF multipliers 431(1)-2, 431(2)-2, 431(3)-2, . . . , and 431(3t+1)-2 may also receive control signals $\theta_0(r), \theta_1(r), \theta_2(r), \ldots, \theta_{3t}(r)$ (where "r" is 0, 1, . . . or 2t−1), respectively, necessary for the error location polynomial operation. The first shared GF multiplier 431(1)-2 among the second group of the shared GF multipliers 431(1)-2, 431(2)-2, 431(3)-2, . . . , and 431(3t+1)-2 may perform a GF multiplying operation on the error location polynomial coefficient $\delta_0(r)$ and the control signal $\theta_0(r)$ (where "r" is 0, 1, . . . or 2t−1) to output the result of the GF multiplying operation. The second shared GF multiplier 431(2)-2 among the second group of the shared GF multipliers 431(1)-2, 431(2)-2, 431(3)-2, ..., and 431(3t+1)-2 may perform a GF multiplying operation on the error location polynomial coefficient $\delta_0(r)$ and the control signal $\theta_1(r)$ (where "r" is 0, 1, ... or 2t−1) to output the result of the GF multiplying operation. The third shared GF multiplier 431(3)-2 among the second group of the shared GF multipliers 431(1)-2, 431(2)-2, 431(3)-2, ..., and 431(3t+1)-2 may perform a GF multiplying operation on the error location polynomial coefficient $\delta_0(r)$ and the control signal $\theta_2(r)$ (where "r" is 0, 1, ... or 2t−1) to output the result of the GF multiplying operation. The $(3t+1)^{th}$ shared GF multiplier 431(3t+1)-2 among the second group of the shared GF multipliers 431(1)-2, 431(2)-2, 431(3)-2, ..., and 431(3t+1)-2 may perform a GF multiplying operation on the error location polynomial coefficient $\delta_0(r)$ and the control signal $\theta_{3t}(r)$ (where "r" is 0, 1, ... or 2t−1) to output the result of the GF multiplying operation.

The number of the shared XOR arithmetic elements in the first error location polynomial calculator 212A may be "(3t+1)." That is, the first error location polynomial calculator 212A may include first to $(3t+1)^{th}$ shared XOR arithmetic elements 441-1(1), 441-1(2), 441-1(3), ..., and 441-1(3t+1). Each of the first to $(3t+1)^{th}$ shared XOR arithmetic elements 441-1(1), 441-1(2), 441-1(3), ..., and 441-1(3t+1) may perform an XOR operation on an output signal of one of the first group of the shared GF multipliers 431(1)-1, 431(2)-1, 431(3)-1, ..., and 431(3t+1)-1 and an output signal of one of the second group of the shared GF multipliers 431(1)-2, 431(2)-2, 431(3)-2, ..., and 431(3t+1)-2 to output one of error location polynomial coefficients $\delta_0(r+1)$, $\delta_1(r+1)$, $\delta_2(r+1)$, ..., and $\delta_{3t}(r+1)$ (where "r" is 0, 1, ..., or 2t−1).

The first shared XOR arithmetic element 441-1(1) may perform an XOR operation on an output signal C of the first shared GF multiplier 431(1)-1 belonging to the first group and an output signal D of the first shared GF multiplier 431(1)-2 belonging to the second group to output the error location polynomial coefficient $\delta_0(r+1)$. The second shared XOR arithmetic element 441-1(2) may perform an XOR operation on an output signal of the second shared GF multiplier 431(2)-1 belonging to the first group and an output signal of the second shared GF multiplier 431(2)-2 belonging to the second group to output the error location polynomial coefficient $\delta_1(r+1)$. The third shared XOR arithmetic element 441-1(3) may perform an XOR operation on an output signal of the third shared GF multiplier 431(3)-1 belonging to the first group and an output signal of the third shared GF multiplier 431(3)-2 belonging to the second group to output the error location polynomial coefficient $\delta_2(r+1)$. The $(3t+1)^{th}$ shared XOR arithmetic element 441-1(3t+1) may perform an XOR operation on an output signal of the $(3t+1)^{th}$ shared GF multiplier 431(3t+1)-1 belonging to the first group and an output signal of the $(3t+1)^{th}$ shared GF multiplier 431(3t+1)-2 belonging to the second group to output the error location polynomial coefficient $\delta_{3t}(r+1)$.

As illustrated in FIG. 10, the second error location polynomial calculator 212B may include three shared MUXs 451, 452, and 453 (i.e., first to third shared MUXs 451, 452, and 453). According to the present embodiment, each of the first to third shared MUXs 451, 452, and 453 may correspond to one of a plurality of shared multiplexing elements constituting the shared multiplexing circuit 330 of the shared logic circuit 210 shown in FIG. 4. The first to third shared MUXs 451, 452, and 453 may correspond to some of the shared MUXs used in the error correction operation.

The first shared MUX 451 may have a first input terminal receiving the error location polynomial coefficient $\delta_0(r)$, a second input terminal receiving the control signal $\gamma(r)$, and an output terminal outputting the control signal $\gamma(r+1)$. The first shared MUX 451 may output the error location polynomial coefficient $\delta_0(r)$ or the control signal $\gamma(r)$ as the control signal $\gamma(r+1)$ in response to a MUX control signal Mcont. That is, the control signal $\gamma(r+1)$ output from the first shared MUX 451 may have the same value as the error location polynomial coefficient $\delta_0(r)$ or the control signal $\gamma(r)$.

The second shared MUX 452 may have a first input terminal receiving a control signal −k(r)−1, a second input terminal receiving a control signal k(r)+1, and an output terminal outputting a control signal k(r+1) (where "r" is 0, 1, ..., or 2t−1). The second shared MUX 452 may output the control signal −k(r)−1 or the control signal k(r)+1 as the control signal k(r+1) in response to the MUX control signal Mcont. That is, the control signal k(r+1) output from the second shared MUX 452 may have the same value as the control signal −k(r)−1 or the control signal k(r)+1.

The third shared MUX 453 may have a first input terminal receiving an error location polynomial coefficient $\delta_{i+1}(r)$, a second input terminal receiving a control signal $\theta_i(r)$, and an output terminal outputting a control signal $\theta_i(r+1)$ (where "i" is 0, 1, ..., 3t, and "r" is 0, 1, ..., or 2t−1). The third shared MUX 453 may output the error location polynomial coefficient $\delta_{i+1}(r)$ or the control signal $\theta_i(r)$ as the control signal $\theta_i(r+1)$ in response to the MUX control signal Mcont. That is, the control signal $\theta_i(r+1)$ output from the third shared MUX 453 may have the same value as the error location polynomial coefficient $\delta_{i+1}(r)$ or the control signal $\theta_i(r)$.

The first to third shared MUXs 451, 452, and 453 may receive the MUX control signal Mcont in common. A level of the MUX control signal Mcont may be determined according to whether a condition of "$\delta_0(r) \neq 0$ and $k(r) \geq 0$" is satisfied. In an embodiment, if the condition of "$\delta_0(r) \neq 0$ and $k(r) \geq 0$" is satisfied, the MUX control signal Mcont may have a logic "low(0)" level. In such a case, the first to third shared MUXs 451, 452, and 453 may output the error location polynomial coefficient $\delta_0(r)$, the control signal −k(r)−1, and the error location polynomial coefficient $\delta_{i+1}(r)$, which are input through the first input terminals of the first to third shared MUXs 451, 452, and 453, respectively. In contrast, if the condition of "$\delta_0(r) \neq 0$ and $k(r) \geq 0$" is not satisfied, the MUX control signal Mcont may have a logic "high(1)" level. In such a case, the first to third shared MUXs 451, 452, and 453 may output the control signal $\gamma(r)$, the control signal k(r)+1, and the control signal $\theta_i(r)$, which are input through the second input terminals of the first to third shared MUXs 451, 452, and 453, respectively. The control signal $\gamma(r+1)$, the control signal k(r+1), and the control signal $\theta_i(r+1)$ output from the first to third shared MUXs 451, 452, and 453 may be used as input data of the first and second groups of the shared GF multipliers in the first error location polynomial calculator 212A.

Figure 11:
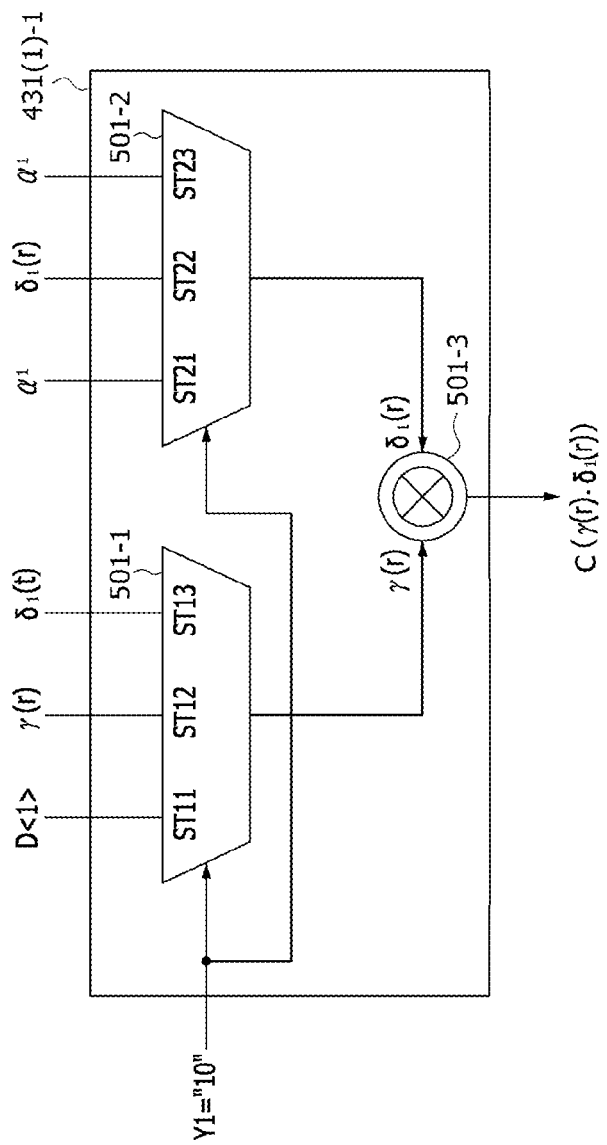
FIG. 11 is a circuit diagram illustrating an example of a first shared Galois field multiplier belonging to a first group of the first error location polynomial calculator shown in FIG. 9.
Figure 12:
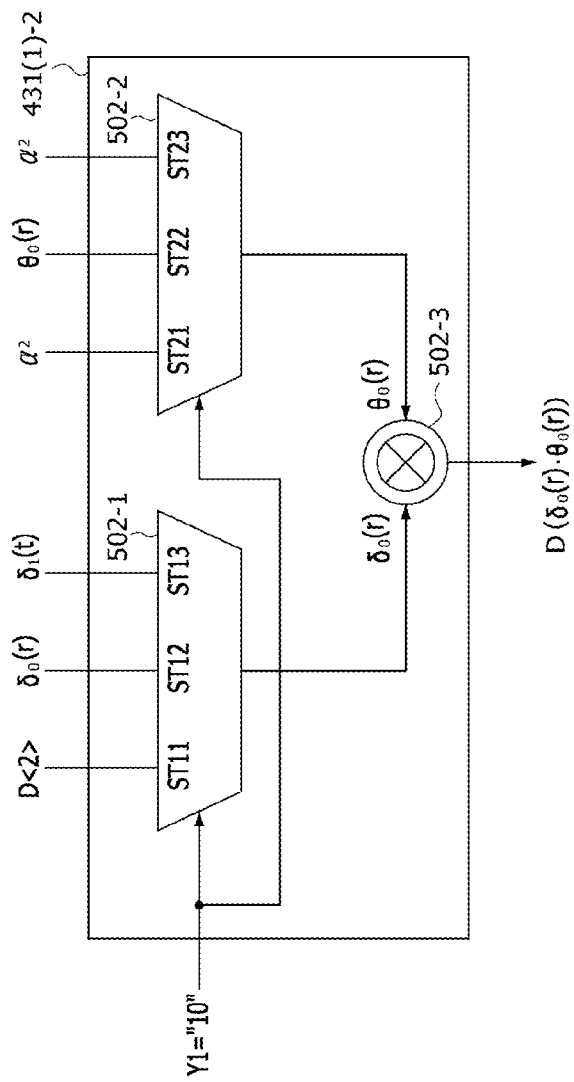
FIG. 12 is a circuit diagram illustrating an example of a first shared Galois field multiplier belonging to a second group of the first error location polynomial calculator shown in FIG. 9.

FIG. 11 is a circuit diagram illustrating an example of the first shared GF multiplier 431(1)-1 at the first level of the first error location polynomial calculator 212A shown in FIG. 9, and FIG. 12 is a circuit diagram illustrating an example of the first shared GF multiplier 431(1)-2 at the second level of the first error location polynomial calculator 212A shown in FIG. 9. Each of the first shared GF multipliers 431(1)-1 and 431(1)-2 may correspond to one of a plurality of shared GF multipliers constituting the shared GF multiplying circuit 320 of the shared logic circuit 210 shown in FIG. 4. Any one of the plurality of shared GF multipliers constituting the shared GF multiplying circuit 320 of the shared logic circuit 210 may be used in the syndrome operation or in the error location polynomial operation. That is, the first shared GF multiplier 431(1)-1 at the first level of the first error location polynomial calculator 212A and the first shared GF multiplier 401(1)-1 included in the first syndrome calculating block 450-1 may be the identical shared GF multiplier. Thus, the first shared GF multiplier 401(1)-1 may function as the first shared GF multiplier 431(1)-1 used in the error location polynomial operation according to a logic level combination of the first control signal Y1 output from the FSM controller 220. In addition, the second shared GF multiplier 431(1)-2 at the second level of the first error location polynomial calculator 212A may be identical to the second shared GF multiplier 401(2)-1 included in the first syndrome calculating block 450-1. Thus, the second shared GF multiplier 401(2)-1 may function as the second shared GF multiplier 431(1)-2 used in the error location polynomial operation according to a logic level combination of the first control signal Y1 output from the FSM controller 220.

First, referring to FIG. 11, the first MUX 501-1 of the first shared GF multiplier 431(1)-1 may have an input terminal, a first state input terminal ST11, a second state input terminal ST12, and a third state input terminal ST13. The first MUX 501-1 may receive the first control signal Y1 from the FSM controller 220 through the input terminal. The first MUX 501-1 may receive the second bit D<1> of the codeword D<0:n−1>, which will be used for the syndrome operation, through the first state input terminal ST11. The first MUX 501-1 may receive the control signal γ(r), which will be used for the error location polynomial operation, through the second state input terminal ST12. The first MUX 501-1 may receive the error location polynomial coefficient $\delta_1(t)$, which will be used for the error location operation, through the third state input terminal ST13. The second MUX 501-2 of the first shared GF multiplier 431(1)-1 may have an input terminal, a first state input terminal ST21, a second state input terminal ST22, and a third state input terminal ST23. The second MUX 501-2 may receive the first control signal Y1 from the FSM controller 220 through the input terminal. The second MUX 501-2 may receive the GF primitive element $\alpha^1$, which will be used for the syndrome operation, through the first state input terminal ST21. The second MUX 501-2 may receive the error location polynomial coefficient $\delta_1(r)$ through the second state input terminal ST22. The second MUX 501-2 may receive the GF primitive element $\alpha^1$, which will be used for the error location operation, through the third state input terminal ST23.

As illustrated in FIG. 11, if the first control signal Y1 output from the FSM controller 220 has a logic level combination "10," both of the first and second MUXs 501-1 and 501-2 may operate in an error location polynomial operation mode. That is, the first MUX 501-1 may output the control signal γ(r), which will be used for the error location polynomial operation, in response to the first control signal Y1 having a logic level combination "10," and the second MUX 501-2 may output the error location polynomial coefficient $\delta_1(r)$ input through the second state input terminal ST22 in response to the first control signal Y1 having a logic level combination "10." The control signal γ(r) output from the first MUX 501-1 and the error location polynomial coefficient $\delta_1(r)$ output from the second MUX 501-2 may be input to the GF multiplier 501-3. The GF multiplier 501-3 may perform a GF multiplying operation on the control signal γ(r) and the error location polynomial coefficient $\delta_1(r)$ to generate the output signal C (γ(r)·$\delta_1(r)$). The output signal C may be input to the first shared XOR arithmetic element 441-1(1).

Next, referring to FIG. 12, the first MUX 502-1 of the first shared GF multiplier 431(1)-2 may have an input terminal, a first state input terminal ST11, a second state input terminal ST12, and a third state input terminal ST13. The first MUX 502-1 may receive the first control signal Y1 from the FSM controller 220 through the input terminal. The first MUX 502-1 may receive the third bit D<2> of the codeword D<0:n−1>, which will be used for the syndrome operation, through the first state input terminal ST11. The first MUX 502-1 may receive the error location polynomial coefficient $\delta_0(r)$ through the second state input terminal ST12. The first MUX 502-1 may receive the error location polynomial coefficient $\delta_1(t)$, which will be used for the error location operation, through the third state input terminal ST13. The second MUX 502-2 of the first shared GF multiplier 431(1)-2 may have an input terminal, a first state input terminal ST21, a second state input terminal ST22 and a third state input terminal ST23. The second MUX 502-2 may receive the first control signal Y1 from the FSM controller 220 through the input terminal. The second MUX 502-2 may receive the GF primitive element $\alpha^2$, which will be used for the syndrome operation, through the first state input terminal ST21. The second MUX 502-2 may receive the control signal $\theta_0(r)$, which will be used for the error location polynomial operation, through the second state input terminal ST22. The second MUX 502-2 may receive the GF primitive element $\alpha^2$, which will be used for the error location operation, through the third state input terminal ST23.

As illustrated in FIG. 12, if the first control signal Y1 output from the FSM controller 220 has a logic level combination "10," both of the first and second MUXs 502-1 and 502-2 may operate in an error location polynomial operation mode. That is, the first MUX 502-1 may output the error location polynomial coefficient $\delta_0(r)$ input through the second state input terminal ST12 in response to the first control signal Y1 having a logic level combination "10," and the second MUX 502-2 may output the control signal $\theta_0(r)$ input through the second state input terminal ST22 in response to the first control signal Y1 having a logic level combination "10." The error location polynomial coefficient $\delta_0(r)$ output from the first MUX 502-1 and the control signal $\theta_0(r)$ output from the second MUX 502-2 may be input to the GF multiplier 502-3. The GF multiplier 502-3 may perform a GF multiplying operation on the error location polynomial coefficient $\delta_0(r)$ and the control signal $\theta_0(r)$ to generate the output signal D ($\delta_0(r)\cdot\theta_0(r)$). The output signal D may be input to the first shared XOR arithmetic element 441-1(1).

Figure 13:
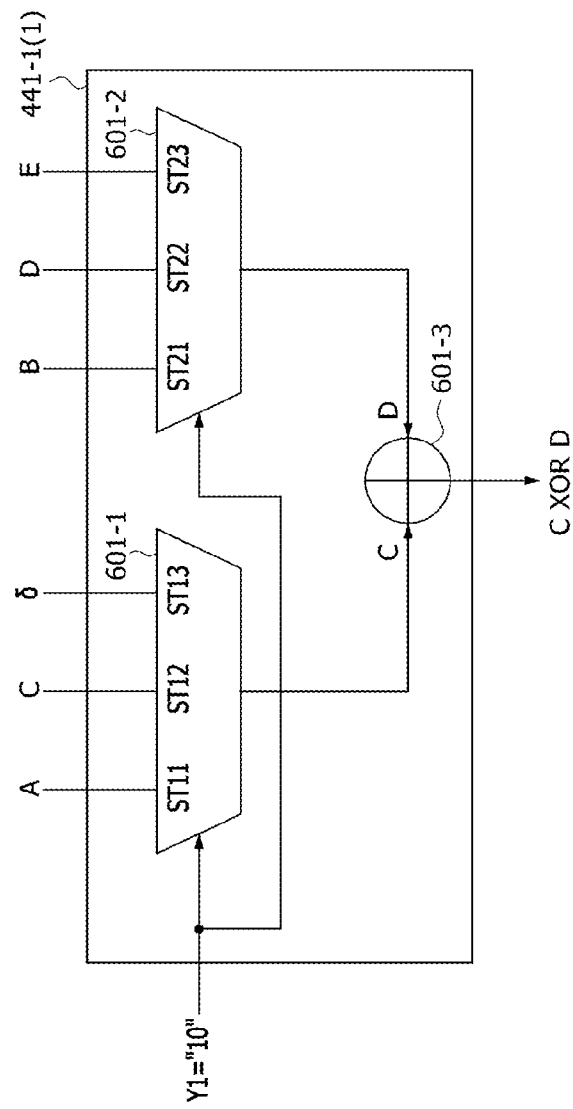
FIG. 13 is a circuit diagram illustrating an example of a first shared XOR arithmetic element included in the first error location polynomial calculator shown in FIG. 9.

FIG. 13 is a circuit diagram illustrating an example of the first shared XOR arithmetic element 441-1(1) included in the first error location polynomial calculator 212A shown in FIG. 9. The first shared XOR arithmetic element 441-1(1) may correspond to one of a plurality of shared XOR arithmetic elements constituting the shared XOR circuit 310 of the shared logic circuit 210. Any one of the plurality of shared XOR arithmetic elements constituting the shared XOR circuit 310 may be used in the syndrome operation or in the error location polynomial operation. That is, the first shared XOR arithmetic element 441-1(1) in the first error location polynomial calculator 212A and the first shared XOR arithmetic element 411-1 (i.e., the leftmost shared XOR arithmetic elements 411-1) at the first level of the first syndrome calculating block 450-1 may be the identical shared XOR arithmetic element. Thus, the first shared XOR arithmetic element 441-1(1) may function as the first shared XOR arithmetic element 411-1 used in the error location polynomial operation according to a logic level combination of the first control signal Y1 output from the FSM controller 220.

Referring to FIG. 13, the first MUX 601-1 of the first shared XOR arithmetic element 411-1(1) may receive the output signal C of the first shared GF multiplier 431(1)-1 through the second state input terminal ST12. The second MUX 601-2 of the first shared XOR arithmetic element 411-1(1) may receive the output signal D of the first shared GF multiplier 431(1)-2 through the second state input terminal ST22. If the first control signal Y1 output from the FSM controller 220 has a logic level combination "10," both of the first and second MUXs 601-1 and 601-2 may operate in the error location polynomial operation mode. That is, the first MUX 601-1 may output the output signal C of the first shared GF multiplier 431(1)-1 input through the second state input terminal ST12 in response to the first control signal Y1 having a logic level combination "10," and the second MUX 601-2 may output the output signal D of the first shared GF multiplier 431(1)-2 input through the second state input terminal ST22 in response to the first control signal Y1 having a logic level combination "10." The output signal C of the first shared GF multiplier 431(1)-1 output from the first MUX 601-1 and the output signal D of the first shared GF multiplier 431(1)-2 outputted from the second MUX 601-2 may be input to the XOR arithmetic element 601-3. The XOR arithmetic element 601-3 may perform an XOR operation on the output signal C and the output signal D to output the result of the XOR operation as an output signal C XOR D. Each of the remaining shared XOR arithmetic elements 441-1(2), 441-1(3), . . . , and 441-1(3t+1) may have the same configuration as the first shared XOR arithmetic elements 411-1(1) except the data input to the second state input terminals ST12 of the first MUXs 601-1 and the second state input terminals ST22 of the second MUXs 601-2.

FIG. 14 illustrates a reformulated inversionless Berlekamp-Massey (RiBM) algorithm used in the error location polynomial operation. Referring to FIG. 14, according to a RiBM algorithm using a BCH code, an initialization step may be performed to set initial values of variables necessary for executing a RiBM algorithm. Next, an input step may be performed to input the syndromes Si, the error location polynomial coefficients, and the control signals $\gamma_i(0)=\theta_i(0)=S_i$ (where "i" is 0, 1, . . . , 2t−1). After the initialization step and the input step are performed, calculation steps using the RiBM algorithm may be performed from when "r" is 0 to when "r" becomes 2t−1. Specifically, at a first step, a calculation operation RiBM1 may be performed to calculate the error location polynomial coefficient δ. The control signals $\theta_i(r+1)$, $\gamma(r+1)$, and $k(r+1)$, which will be used for the calculation operation RiBM1, may be set by a variable set operation RiBM2. The variable set operation RiBM2 may be performed differently according to whether a condition of "$\delta_0(r)\neq 0$ and $k(r)\geq 0$" is satisfied. If the condition of "$\delta_0(r)\neq 0$ and $k(r)\geq 0$" is satisfied, the control signals $\theta_i(r+1)$, $\gamma(r+1)$ and $k(r+1)$ may be set to have values of $\delta_{i+1}(r)$, $\delta_0(r)$ and $-k(r)-1$, respectively. In contrast, if the condition of "$\delta_0(r)\neq 0$ and $k(r)\geq 0$" is not satisfied, the control signals $\theta_i(r+1)$, $\gamma(r+1)$, and $k(r+1)$ may be set to $\theta_i(r)$, $\gamma(r)$, and $k(r)+1$, respectively. If the above calculation steps are performed from when "r" is 0 to when "r" becomes 2t−1, a final output signal Output expressed by an equation of "$\lambda_i(2t)=\delta_{i+t}(2t)$ (where "i" is 0, 1, . . . , t)" may be output.

In FIG. 14, the calculation operation RiBM1 for extracting the error location polynomial coefficient $\delta_i(r+1)$ using an equation of "$\delta_i(r+1)=\gamma(r)\cdot\delta_{i+1}(r)-\delta_0(r)\cdot\theta_i(r)$ (where "i" is 0, 1, . . . , 3t)" may be performed by the first error location polynomial calculator 212A of FIG. 9. As described with reference to FIG. 9, a GF multiplying operation "$\gamma(r)\cdot\delta_{i+1}(r)$" in the above equation "$\delta_i(r+1)=\gamma(r)\cdot\delta_{i+1}(r)-\delta_0(r)\cdot\theta_i(r)$ (where "i" is 0, 1, . . . , 3t)" may be performed by the first group of the shared GF multipliers 431(1)-1, 431(2)-1, 431(3)-1, . . . , and 431(3t+1)-1, and a GF multiplying operation "$\delta_0(r)\cdot\theta_i(r)$" in the above equation "$\delta_i(r+1)=\gamma(r)\cdot\delta_{i+1}(r)-\delta_0(r)\cdot\theta_i(r)$ (where "i" is 0, 1, . . . , 3t)" may be performed by the second group of the shared GF multipliers 431(1)-2, 431(2)-2, 431(3)-2, . . . , and 431(3t+1)-2. In addition, the shared XOR arithmetic elements 441-1(1), 441-1(2), 441-1(3), . . . , and 441-1(3t+1) may perform XOR operations on $\gamma(r)\cdot\delta_{i+1}(r)$ and $\delta_0(r)\cdot\theta_i(r)$ to output the error location polynomial coefficients $\delta_i(r+1)$, respectively (where "i" is 0, 1, . . . , 3t). In the event that the RiBM algorithm is used at the condition of "r=2t−1," only the error location polynomial coefficients $\delta_{i+t}(2t)$ (where "i" is 0, 1, . . . , t) among the output data of the shared XOR arithmetic elements 441-1(1), 441-1(2), 441-1(3), . . . , and 441-1(3t+1) may be used for the error location operation in a subsequent step.

In FIG. 14, the variable set operation RiBM2 for setting the control signals $\theta_i(r+1)$, $\gamma(r+1)$, and $k(r+1)$ may be performed by the second error location polynomial calculator 212B of FIG. 10. As described with reference to FIG. 10, the MUX control signal Mcont input to the shared MUXs 451, 452, and 453 may be different according to whether the condition of "$\delta_0(r)\neq 0$ and $k(r)\geq 0$" is satisfied. If the MUX control signal Mcont having a logic "low(0)" level is input to the shared MUXs 451, 452, and 453 when the condition of "$\delta_0(r)\neq 0$ and $k(r)\geq 0$" is satisfied, the shared MUXs 451, 452, and 453 may output the data $\delta_0(r)$, $-k(r)-1$, and $\delta_{i+1}(r)$ input through the first input terminals of the shared MUXs 451, 452, and 453 as the control signals $\gamma(r+1)$, $k(r+1)$, and $\theta_i(r+1)$, respectively. In such a case, the control signals $\gamma(r+1)$, $k(r+1)$, and $\theta_i(r+1)$ output from the shared MUXs 451, 452, and 453 may be used in the operations performed by the first error location polynomial calculator 212A. In contrast, if the MUX control signal Mcont having a logic "high(1)" level is input to the shared MUXs 451, 452, and 453 when the condition of "$\delta_0(r)\neq 0$ and $k(r)\geq 0$" is not satisfied, the shared MUXs 451, 452, and 453 may output the data $\gamma(r)$, $k(r)+1$, and $\theta_i(r)$ input through the second input terminals of the shared MUXs 451, 452, and 453 as the control signals $\gamma(r+1)$, $k(r+1)$, and $\theta_i(r+1)$, respectively. In such a case, the control signals $\gamma(r+1)$, $k(r+1)$, and $\theta_i(r+1)$ output from the shared MUXs 451, 452, and 453 may be used in the operations performed by the first error location polynomial calculator 212A.

Figure 15:
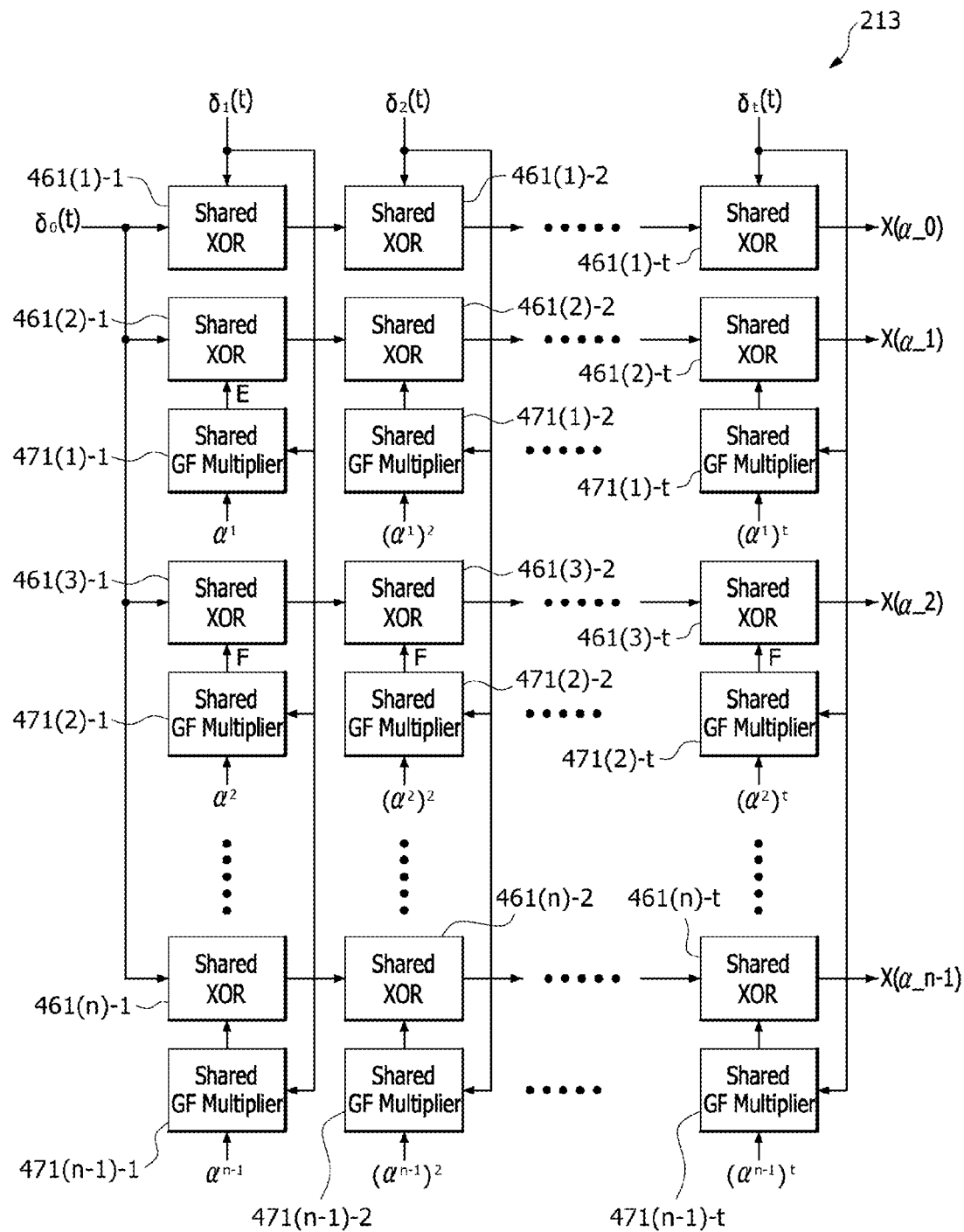
FIG. 15 is a block diagram illustrating a logical configuration of an error location calculator that is controlled by constituent elements of the shared logic circuit of FIG. 4 to execute an error location operation.

FIG. 15 is a block diagram illustrating a logical configuration of the error location calculator 213, which is controlled by constituent elements of the shared logic circuit 210 of FIG. 4 to execute an error location operation. Referring to FIG. 15, the error location calculator 213 may include a plurality of shared XOR arithmetic elements and a plurality of shared GF multipliers. The error location calculator 213 may perform GF multiplying operations and XOR operations on the error location polynomial coefficients to output "n"-bit output data $X(\alpha\_0)$, $X(\alpha\_1)$, $X(\alpha\_2)$, . . . , and $X(\alpha\_n-1)$ including information on error locations. The plurality of shared XOR arithmetic elements of the error location calculator 213 461(1)-1, 461(1)-2, . . . , and 461(1)-t, . . . , 461(n)-1, 461(n)-2, . . . , and 461(n)-t may be divided into may first to $n^{th}$ groups. The plurality of shared GF multipliers of the error location calculator 213 471(1)-1, 471(1)-2, ..., and 471(1)-t, ..., 471(n−1)-1, 471(n−1)-2, ..., and 471(n−1)-t may be divided into first to (n−1)$^{th}$ groups. The number of shared XOR arithmetic elements per group and the number of shared GF multipliers per group may be "t." Since there are the first to n$^{th}$ groups of shared XOR arithmetic elements and each group of the shared XOR arithmetic elements has "t" shared XOR arithmetic elements (i.e., the number of shared XOR arithmetic elements is "t"), the total number of the shared XOR arithmetic elements in the error location calculator 213 may be "t×n." In addition, since there are the first to (n−1)$^{th}$ groups of shared GF multipliers and each group of the shared GF multipliers has "t" shared GF multipliers (i.e., the number of shared GF multipliers is "t"), the total number of the shared GF multipliers in the error location calculator 213 may be "t×(n−1)." In the present embodiment, each of the shared XOR arithmetic elements in the error location calculator 213 may correspond to one of a plurality of shared XOR arithmetic elements constituting the shared XOR circuit 310 of the shared logic circuit 210 shown in FIG. 4, and each of the shared GF multipliers in the error location calculator 213 may correspond to one of a plurality of a plurality of shared GF multipliers constituting the shared GF multiplying circuit 320 of the shared logic circuit 210 shown in FIG. 4.

An LSB $X(\alpha\_0)$ of the "n"-bit output data $X(\alpha\_0)$, $X(\alpha\_1)$, $X(\alpha\_2)$, ..., and $X(\alpha\_n-1)$ may be generated by the shared XOR arithmetic elements 461(1)-1, 461(1)-2, ..., and 461(1)-t belonging to the first group. A second bit $X(\alpha\_1)$ of the "n"-bit output data $X(\alpha\_0)$, $X(\alpha\_1)$, $X(\alpha\_2)$, ..., and $X(\alpha\_n-1)$ may be generated by the shared XOR arithmetic elements 461(2)-1, 461(2)-2, ..., and 461(2)-t belonging to the second group and the shared GF multipliers 471(1)-1, 471(1)-2, ..., and 471(1)-t belonging to the first group. A third bit $X(\alpha\_2)$ of the "n"-bit output data $X(\alpha\_0)$, $X(\alpha\_1)$, $X(\alpha\_2)$, ..., and $X(\alpha\_n-1)$ may be generated by the shared XOR arithmetic elements 461(3)-1, 461(3)-2, ..., and 461(3)-t belonging to the third group and the shared GF multipliers 471(2)-1, 471(2)-2, ..., and 471(2)-t belonging to the second group. Similarly, an n$^{th}$ bit $X(\alpha\_n-1)$ of the "n"-bit output data $X(\alpha\_0)$, $X(\alpha\_1)$, $X(\alpha\_2)$, ..., and $X(\alpha\_n-1)$ may be generated by the shared XOR arithmetic elements 461(n)-1, 461(n)-2, ..., and 461(n)-t belonging to the n$^{th}$ group and the shared GF multipliers 471(n−1)-1, 471(n−1)-2, ..., and 471(n−1)-t belonging to the (n−1)$^{th}$ group.

The error location polynomial coefficient $\delta_0(t)$ may be input to the first shared XOR arithmetic elements 461(1)-1, 461(2)-1, 461(3)-1, ..., and 461(n)-1 belonging to the first to n$^{th}$ groups of the shared XOR arithmetic elements. In each group of the shared XOR arithmetic elements, an M$^{th}$ shared XOR arithmetic element may receive an output signal of an (M−1)$^{th}$ shared XOR arithmetic element (where "M" is a natural number larger than or equal to two). For example, the second shared XOR arithmetic element 461(1)-2 belonging to the first group of the shared XOR arithmetic elements may receive an output signal of the first shared XOR arithmetic element 461(1)-1 belonging to the first group of the shared XOR arithmetic elements. In addition, an output signal of the second shared XOR arithmetic element 461(1)-2 belonging to the first group of the shared XOR arithmetic elements may be input to the third shared XOR arithmetic element 461(1)-3 belonging to the first group of the shared XOR arithmetic elements. Moreover, the last (i.e., the t$^{th}$) shared XOR arithmetic element 461(1)-t belonging to the first group of the shared XOR arithmetic elements may receive an output signal of the (n−1)$^{th}$ shared XOR arithmetic element 461(1)-(t-1) belonging to the first group of the shared XOR arithmetic elements. An output signal of the t$^{th}$ shared XOR arithmetic element 461(1)-t belonging to the first group of the shared XOR arithmetic elements may correspond to the LSB $X(\alpha\_0)$ of the "n"-bit output data.

An output signal of the first shared GF multiplier 471(1)-1 belonging to the first group of the shared GF multipliers may be input to the first shared XOR arithmetic element 461(2)-1 belonging to the second group of the shared XOR arithmetic elements. An output signal of the second shared GF multiplier 471(1)-2 belonging to the first group of the shared GF multipliers may be input to the second shared XOR arithmetic element 461(2)-2 belonging to the second group of the shared XOR arithmetic elements. In this way, an output signal of the t$^{th}$ shared GF multiplier 471(1)-t belonging to the first group of the shared GF multipliers may be input to the t$^{th}$ shared XOR arithmetic element 461(2)-t belonging to the second group of the shared XOR arithmetic elements. Output signals of the shared GF multipliers 471(2)-1, 471(2)-2, ..., and 471(2)-t belonging to the second group of the shared GF multipliers may be input to the second shared XOR arithmetic elements 461(3)-1, 461(3)-2, ..., and 461(3)-t belonging to the third group of the shared XOR arithmetic elements, respectively. Similarly, output signals of the shared GF multipliers 471(2)-1, 471(2)-2, ..., and 471(2)-t belonging to the (n−1)$^{th}$ group of the shared GF multipliers may be input to the shared XOR arithmetic elements 461(n)-1, 461(n)-2, ..., and 461(n)-t belonging to the n$^{th}$ group of the shared XOR arithmetic elements, respectively.

Hereinafter, a generation procedure of the LSB $X(\alpha\_0)$ will be descried. The error location polynomial coefficients $\delta_0(t)$ and $\delta_1(t)$ may be input to the first shared XOR arithmetic element 461(1)-1 belonging to the first group of the shared XOR arithmetic elements. The first shared XOR arithmetic element 461(1)-1 belonging to the first group of the shared XOR arithmetic elements may perform an XOR operation on the error location polynomial coefficients $\delta_0(t)$ and $\delta_1(t)$ to output the result of the XOR operation to the second shared XOR arithmetic element 461(1)-2 belonging to the first group of the shared XOR arithmetic elements. The second shared XOR arithmetic element 461(1)-2 belonging to the first group of the shared XOR arithmetic elements may perform an XOR operation on an output signal of the first shared XOR arithmetic element 461(1)-1 and the error location polynomial coefficient $\delta_2(t)$ to output the result of the XOR operation to the third shared XOR arithmetic element 461(1)-3 belonging to the first group of the shared XOR arithmetic elements. In this way, the t$^{th}$ shared XOR arithmetic element 461(1)-t belonging to the first group of the shared XOR arithmetic elements may perform an XOR operation on an output signal of the (t−1)$^{th}$ shared XOR arithmetic element 461(1)-(t-1) and the error location polynomial coefficient $\delta_t(t)$ to output the result of the XOR operation as the LSB $X(\alpha\_0)$.

Hereinafter, a generation procedure of the second bit $X(\alpha\_1)$ will be descried. The first shared GF multiplier 471(1)-1 belonging to the first group of the shared GF multipliers may perform a GF multiplying operation on the error location polynomial coefficient $\delta_1(t)$ and the GF primitive element $\alpha^1$ to output the result of the GF multiplying operation to the first shared XOR arithmetic element 461(2)-1 belonging to the second group of the shared XOR arithmetic elements. The first shared XOR arithmetic element 461(2)-1 belonging to the second group of the shared XOR arithmetic elements may perform an XOR operation on an output signal E of the first shared GF multiplier

471(1)-1 and the error location polynomial coefficient $\delta_0(t)$ to output the result of the XOR operation to the second shared XOR arithmetic element 461(2)-2 belonging to the second group of the shared XOR arithmetic elements. The second shared GF multiplier 471(1)-2 belonging to the first group of the shared GF multipliers may perform a GF multiplying operation on the error location polynomial coefficient $\delta_2(t)$ and the GF primitive element $(\alpha^1)^2$ to output the result of the GF multiplying operation to the second shared XOR arithmetic element 461(2)-2 belonging to the second group of the shared XOR arithmetic elements. The second shared XOR arithmetic element 461(2)-2 belonging to the second group of the shared XOR arithmetic elements may perform an XOR operation on an output signal of the second shared GF multiplier 471(1)-2 and an output signal of the first shared XOR arithmetic element 461(2)-1 to output the result of the XOR operation to the third shared XOR arithmetic element belonging to the second group of the shared XOR arithmetic elements. In this way, the $t^{th}$ shared GF multiplier 471(1)-$t$ belonging to the first group of the shared GF multipliers may perform a GF multiplying operation on the error location polynomial coefficient $\delta_t(t)$ and the GF primitive element $(\alpha^1)^t$ to output the result of the GF multiplying operation to the $t^{th}$ shared XOR arithmetic element 461(2)-$t$ belonging to the second group of the shared XOR arithmetic elements. The $t^{th}$ shared XOR arithmetic element 461(2)-$t$ belonging to the second group of the shared XOR arithmetic elements may perform an XOR operation on an output signal of the $t^{th}$ shared GF multiplier 471(1)-$t$ and an output signal of the $(t-1)^{th}$ shared XOR arithmetic element 461(2)-($t$-1) to output the result of the XOR operation as the second bit $X(\alpha\_1)$.

Similarly, a generation procedure of the $n^{th}$ bit $X(\alpha\_n-1)$ will be descried hereinafter. The first shared GF multiplier 471($n$-1)-1 belonging to the $(n-1)^{th}$ group of the shared GF multipliers may perform a GF multiplying operation on the error location polynomial coefficient $\delta_1(t)$ and the GF primitive element $\alpha^{n-1}$ to output the result of the GF multiplying operation to the first shared XOR arithmetic element 461($n$)-1 belonging to the $n^{th}$ group of the shared XOR arithmetic elements. The first shared XOR arithmetic element 461($n$)-1 belonging to the $n^{th}$ group of the shared XOR arithmetic elements may perform an XOR operation on an output signal of the first shared GF multiplier 471($n$-1)-1 and the error location polynomial coefficient $\delta_0(t)$ to output the result of the XOR operation to the second shared XOR arithmetic element 461($n$)-2 belonging to the $n^{th}$ group of the shared XOR arithmetic elements. The second shared GF multiplier 471($n$-1)-2 belonging to the $(n-1)^{th}$ group of the shared GF multipliers may perform a GF multiplying operation on the error location polynomial coefficient $\delta_2(t)$ and the GF primitive element $(\alpha^{n-1})^2$ to output the result of the GF multiplying operation to the second shared XOR arithmetic element 461($n$)-2 belonging to the $n^{th}$ group of the shared XOR arithmetic elements. The second shared XOR arithmetic element 461($n$)-2 belonging to the $n^{th}$ group of the shared XOR arithmetic elements may perform an XOR operation on an output signal of the second shared GF multiplier 471($n$-1)-2 and an output signal of the first shared XOR arithmetic element 461($n$)-1 to output the result of the XOR operation to the third shared XOR arithmetic element belonging to the $n^{th}$ group of the shared XOR arithmetic elements. In this way, the $t^{th}$ shared GF multiplier 471($n$-1)-$t$ belonging to the $(n-1)^{th}$ group of the shared GF multipliers may perform a GF multiplying operation on the error location polynomial coefficient $\delta_t(t)$ and the GF primitive element $(\alpha^{n-1})^t$ to output the result of the GF multiplying operation to the $t^{th}$ shared XOR arithmetic element 461($n$)-$t$ belonging to the $n^{th}$ group of the shared XOR arithmetic elements. The $t^{th}$ shared XOR arithmetic element 461($n$)-$t$ belonging to the $n^{th}$ group of the shared XOR arithmetic elements may perform an XOR operation on an output signal of the $t^{th}$ shared GF multiplier 471($n$-1)-$t$ and an output signal of the $(t-1)^{th}$ shared XOR arithmetic element 461($n$)-($t$-1) to output the result of the XOR operation as the $n^{th}$ bit $X(\alpha\_n-1)$.

A logic level of an erroneous bit among the "n"-bit output data $X(\alpha\_0)$, $X(\alpha\_1)$, $X(\alpha\_2)$, ..., and $X(\alpha\_n-1)$ output from the error location calculator 213 may be set according the embodiments. For example, in an embodiment, an erroneous bit among the "n"-bit output data $X(\alpha\_0)$, $X(\alpha\_1)$, $X(\alpha\_2)$, ..., and $X(\alpha\_n-1)$ may have a logic "high(1)" level and a non-erroneous bit among the "n"-bit output data $X(\alpha\_0)$, $X(\alpha\_1)$, $X(\alpha\_2)$, ..., and $X(\alpha\_n-1)$ may have a logic "low(0)" level. Alternatively, an erroneous bit among the "n"-bit output data $X(\alpha\_0)$, $X(\alpha\_1)$, $X(\alpha\_2)$, ..., and $X(\alpha\_n-1)$ may have a logic "low(0)" level and a non-erroneous bit among the "n"-bit output data $X(\alpha\_0)$, $X(\alpha\_1)$, $X(\alpha\_2)$, ..., and $X(\alpha\_n-1)$ may have a logic "high(1)" level.

Figure 16:
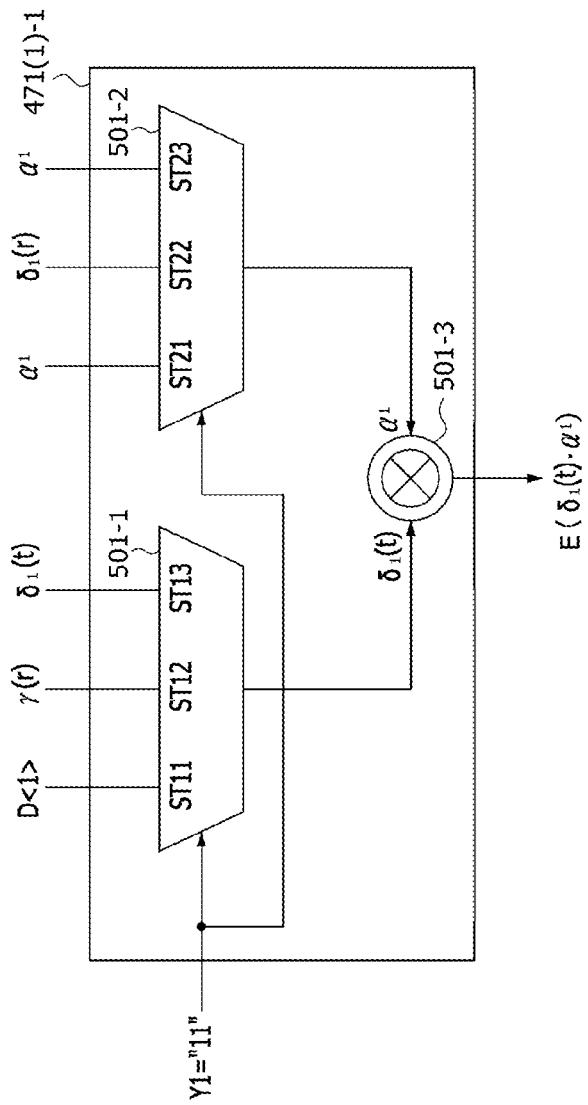
FIG. 16 is a circuit diagram illustrating an example of a first shared Galois field multiplier belonging to a first group of shared Galois field multipliers of the error location calculator of FIG. 15.
Figure 17:
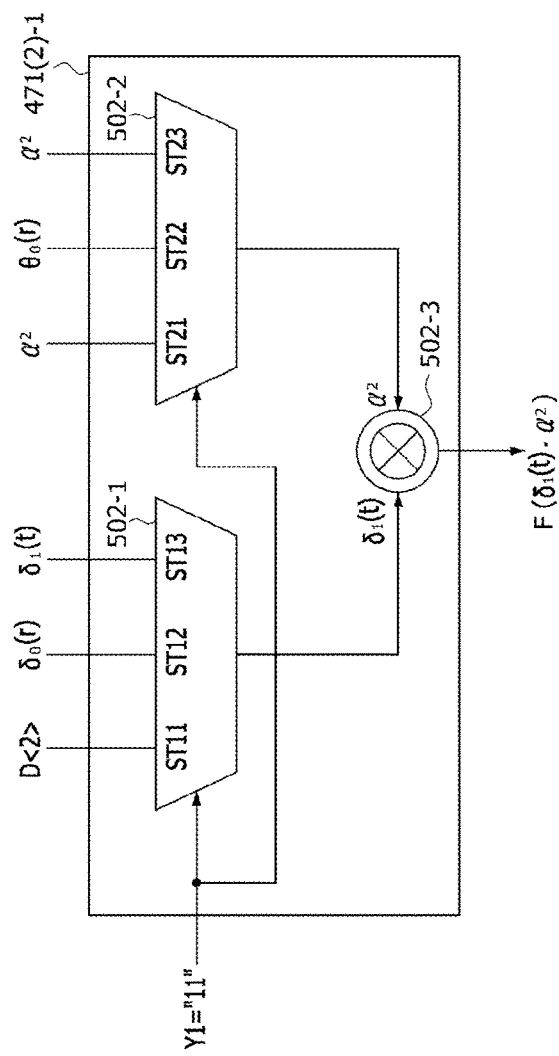
FIG. 17 is a circuit diagram illustrating an example of a first shared Galois field multiplier belonging to a second group of shared Galois field multipliers of the error location calculator of FIG. 15.

FIG. 16 is a circuit diagram illustrating an example of the first shared GF multiplier 471(1)-1 belonging to the first group of the shared GF multipliers of the error location calculator 213 of FIG. 15, and FIG. 17 is a circuit diagram illustrating an example of a first shared GF multiplier 471(2)-1 belonging to the second group of the shared GF multipliers of the error location calculator 213 of FIG. 15. Each of the first shared GF multiplier 471(1)-1 belonging to the first group of the shared GF multipliers and the first shared GF multiplier 471(2)-1 belonging to the second group of the shared GF multipliers may correspond to one of the plurality of shared GF multipliers constituting the shared GF multiplying circuit 320 of the shared logic circuit 210 shown in FIG. 4. Any one of the plurality of shared GF multipliers constituting the shared GF multiplying circuit 320 of the shared logic circuit 210 may be used in the syndrome operation, the error location polynomial operation, or the error location operation. That is, the first shared GF multiplier 471(1)-1 belonging to the first group of the shared GF multipliers, the first shared GF multiplier 401(1)-1 included in the first syndrome calculating block 450-1, and the first shared GF multiplier 431(1)-1 at the first level of the first error location polynomial calculator 212A may be the identical shared GF multiplier. Thus, the first shared GF multiplier 471(1)-1 belonging to the first group of the shared GF multipliers may be used in the error location polynomial operation according to a logic level combination of the first control signal Y1 output from the FSM controller 220. In addition, the first shared GF multiplier 471(2)-1 belonging to the second group of the shared GF multipliers may be identical to the second shared GF multiplier 401(1)-2 included in the first syndrome calculating block 450-1 and the first shared GF multiplier 431(1)-2 at the second level of the first error location polynomial calculator 212A. Thus, the first shared GF multiplier 471(2)-1 belonging to the second group of the shared GF multipliers may be used in the error location polynomial operation according to a logic level combination of the first control signal Y1 output from the FSM controller 220.

First, referring to FIG. 16, the first MUX 501-1 of the first shared GF multiplier 471(1)-1 may have an input terminal, a first state input terminal ST11, a second state input terminal ST12, and a third state input terminal ST13. The first MUX 501-1 may receive the first control signal Y1 from the FSM controller 220 through the input terminal. The first MUX 501-1 may receive the second bit D<1> of the codeword D<0:n−1>, which will be used for the syndrome operation, through the first state input terminal ST11. The first MUX 501-1 may receive the control signal γ(r), which will be used for the error location polynomial operation, through the second state input terminal ST12. The first MUX 501-1 may receive the error location polynomial coefficient $δ_1(t)$, which will be used for the error location operation, through the third state input terminal ST13. The second MUX 501-2 of the first shared GF multiplier 471(1)-1 may have an input terminal, a first state input terminal ST21, a second state input terminal ST22, and a third state input terminal ST23. The second MUX 501-2 may receive the first control signal Y1 from the FSM controller 220 through the input terminal. The second MUX 501-2 may receive the GF primitive element $α^1$, which will be used for the syndrome operation, through the first state input terminal ST21. The second MUX 501-2 may receive the error location polynomial coefficient $δ_1(r)$ through the second state input terminal ST22. The second MUX 501-2 may receive the GF primitive element $α^1$, which will be used for the error location operation, through the third state input terminal ST23.

As illustrated in FIG. 16, if the first control signal Y1 output from the FSM controller 220 has a logic level combination "11," both of the first and second MUXs 501-1 and 501-2 may operate in an error location operation mode. That is, the first MUX 501-1 may output the error location polynomial coefficient $δ_1(t)$ input through the third state input terminal ST13 in response to the first control signal Y1 having a logic level combination "11," and the second MUX 501-2 may output the GF primitive element $α^1$ input through the third state input terminal ST23 in response to the first control signal Y1 having a logic level combination "11." The error location polynomial coefficient $δ_1(t)$ output from the first MUX 501-1 and the GF primitive element $α^1$ output from the second MUX 501-2 may be input to the GF multiplier 501-3. The GF multiplier 501-3 may perform a GF multiplying operation on the error location polynomial coefficient $δ_1(t)$ and the GF primitive element $α^1$ to generate the output signal E ($δ_1(t)·α^1$). As described with reference to FIG. 15, the output signal E may be input to the first shared XOR arithmetic element 461(2)-1 in the second group of the shared XOR arithmetic elements.

Next, referring to FIG. 17, the first MUX 502-1 of the first shared GF multiplier 471(2)-1 may have an input terminal, a first state input terminal ST11, a second state input terminal ST12, and a third state input terminal ST13. The first MUX 502-1 may receive the first control signal Y1 from the FSM controller 220 through the input terminal. The first MUX 502-1 may receive the third bit D<2> of the codeword D<0:n−1>, which will be used for the syndrome operation through the first state input terminal ST11. The first MUX 502-1 may receive the error location polynomial coefficient $δ_0(r)$, which will be used for the error location polynomial operation, through the second state input terminal ST12. The first MUX 502-1 may receive the error location polynomial coefficient $δ_1(t)$, which will be used for the error location operation, through the third state input terminal ST13. The second MUX 502-2 of the first shared GF multiplier 471(2)-1 may have an input terminal, a first state input terminal ST21, a second state input terminal ST22, and a third state input terminal ST23. The second MUX 502-2 may receive the first control signal Y1 from the FSM controller 220 through the input terminal. The second MUX 502-2 may receive the GF primitive element $α^2$, which will be used for the syndrome operation, through the first state input terminal ST21. The second MUX 502-2 may receive the control signal $θ_0(r)$ through the second state input terminal ST22. The second MUX 502-2 may receive the GF primitive element $α^2$, which will be used for the error location operation through the third state input terminal ST23.

As illustrated in FIG. 17, if the first control signal Y1 output from the FSM controller 220 has a logic level combination "11," both of the first and second MUXs 502-1 and 502-2 may operate in an error location operation mode. That is, the first MUX 502-1 may output the error location polynomial coefficient $δ_1(t)$ input through the third state input terminal ST13 in response to the first control signal Y1 having a logic level combination "11," and the second MUX 502-2 may output the GF primitive element $α^2$ input through the third state input terminal ST23 in response to the first control signal Y1 having a logic level combination "11." The error location polynomial coefficient $δ_1(t)$ output from the first MUX 502-1 and the GF primitive element $α^2$ output from the second MUX 502-2 may be input to the GF multiplier 502-3. The GF multiplier 502-3 may perform a GF multiplying operation on the error location polynomial coefficient $δ_1(t)$ and the GF primitive element $α^2$ to generate the output signal F ($δ_1(t)·α^2$). The output signal F may be input to the first shared XOR arithmetic element 461(3)-1 belonging to the third group of the shared XOR arithmetic elements.

Figure 18:
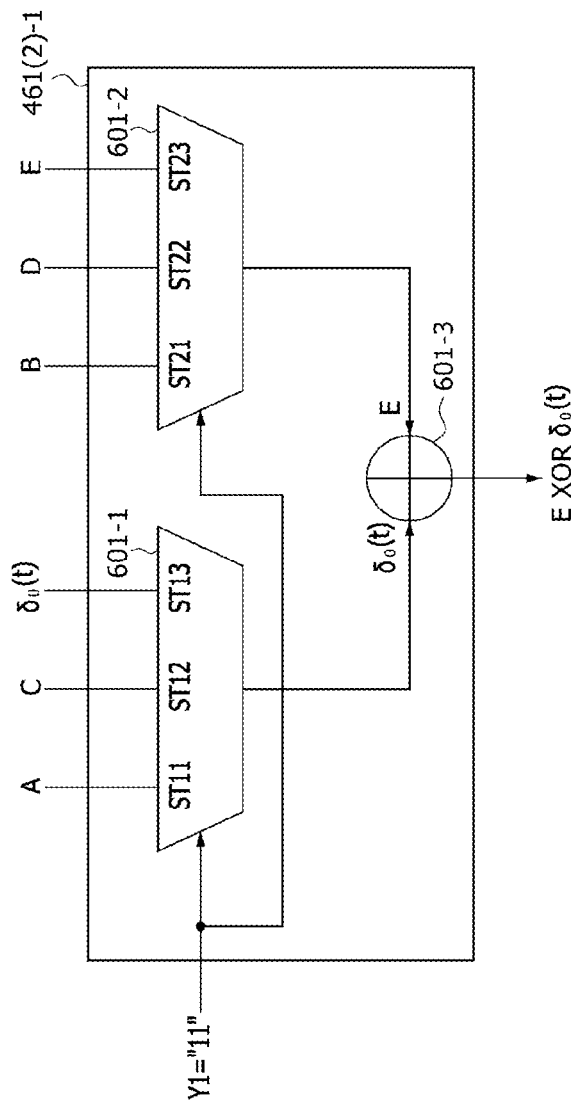
FIG. 18 is a circuit diagram illustrating an example of a first shared XOR arithmetic element belonging to a second group of shared XOR arithmetic elements of the error location calculator of FIG. 15.

FIG. 18 is a circuit diagram illustrating an example of the first shared XOR arithmetic element 461(2)-1 included in the second group of the shared XOR arithmetic elements shown in FIG. 15. The first shared XOR arithmetic element 461(2)-1 may correspond to any one of a plurality of shared XOR arithmetic elements constituting the shared XOR circuit 310 of the shared logic circuit 210. Any one of the plurality of shared XOR arithmetic elements constituting the shared XOR circuit 310 may be used in the syndrome operation, the error location polynomial operation, or the error location operation. That is, the first shared XOR arithmetic element 461(2)-1 belonging to the second group of the shared XOR arithmetic elements may be identical to the first shared XOR arithmetic element 411-1 (i.e., the leftmost shared XOR arithmetic elements 411-1) at the first level of the first syndrome calculating block 450-1, and may be identical to the first shared XOR arithmetic element 441-1(1) of the first error location polynomial calculator 212A. Thus, the first shared XOR arithmetic element 461(2)-1 may be used in the error location polynomial operation according to a logic level combination of the first control signal Y1 output from the FSM controller 220.

Referring to FIG. 18, the first MUX 601-1 of the first shared XOR arithmetic element 461(2)-1 may receive the error location polynomial coefficient $δ_0(t)$ through the third state input terminal ST13. The second MUX 601-2 of the first shared XOR arithmetic element 461(2)-1 may receive the output signal E of the first shared GF multiplier 471(1)-1 through the third state input terminal ST23. If the first control signal Y1 output from the FSM controller 220 has a logic level combination "11," both of the first and second MUXs 601-1 and 601-2 may operate in the error location operation mode. That is, the first MUX 601-1 may output the error location polynomial coefficient $δ_0(t)$ input through the third state input terminal ST13 in response to the first control signal Y1 having a logic level combination "11," and the second MUX 601-2 may output the output signal E of the first shared GF multiplier 471(1)-1 input through the third state input terminal ST23 in response to the first control signal Y1 having a logic level combination "11." The error location polynomial coefficient $δ_0(t)$ output from the first MUX 601-1 and the output signal E output from the second MUX 601-2 may be input to the XOR arithmetic element 601-3. The XOR arithmetic element 601-3 may perform an XOR operation on the error location polynomial coefficient $\delta_0(t)$ and the output signal E to output the result of the XOR operation as an output signal E XOR $\delta_0$ (t). Each of the remaining shared XOR arithmetic elements may have the same configuration as the first shared XOR arithmetic element 461(2)-1 except the data input to the third state input terminals ST13 of the first MUXs 601-1 and the third state input terminals ST23 of the second MUXs 601-2.

Figure 19:
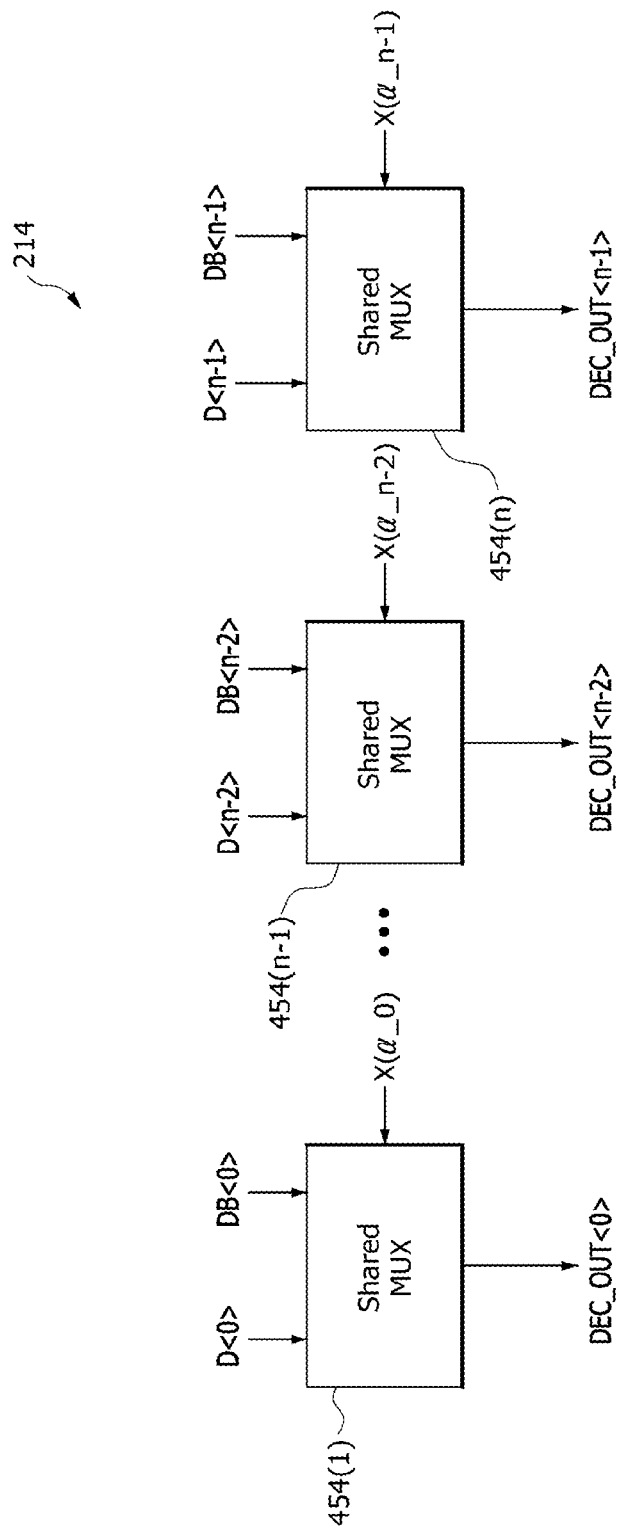
FIG. 19 is a block diagram illustrating a logical configuration of an error corrector that is controlled by constituent elements of the shared logic circuit of FIG. 4 to execute an error correction operation.

FIG. 19 is a block diagram illustrating a logical configuration of the error corrector 214 that is controlled by constituent elements of the shared logic circuit 210 of FIG. 4 to execute an error correction operation. Referring to FIG. 19, the error corrector 214 may include "n" shared MUXs 454(1), . . . , 454(n-1) and 454(n). That is, the error corrector 214 may include first to $n^{th}$ shared MUXs 454(1), . . . , 454(n-1) and 454(n). Each of the first to $n^{th}$ shared MUXs 454(1), . . . , 454(n-1) and 454(n) may correspond to one of a plurality of shared multiplexing elements constituting the shared multiplexing circuit 330 of the shared logic circuit 210 shown in FIG. 4. In addition, some of the first to $n^{th}$ shared MUXs 454(1), . . . , 454(n-1) and 454(n) may be used as the first to third shared MUXs 451, 452 and 453 constituting the second error location polynomial calculator 212B of FIG. 10 during the error correction operation.

Each of the first to $n^{th}$ shared MUXs 454(1), . . . , 454(n-1) and 454(n) may have a first input terminal, a second input terminal, a third input terminal, and an output terminal. Data of the codeword D<0:n-1> may be input to the first input terminals of the first to $n^{th}$ shared MUXs 454(1), . . . , 454(n-1) and 454(n), respectively. That is, the data bits from the LSB D<0> to the MSB D<n-1> of the codeword D<0:n-1> may be input to the first input terminals of the first to $n^{th}$ shared MUXs 454(1), . . . , 454(n-1) and 454(n), respectively. Inverted data bits of the codeword D<0:n-1> may be input to the second input terminals of the first to $n^{th}$ shared MUXs 454(1), . . . , 454(n-1) and 454(n), respectively. That is, inverted data bits from an inverted data bit DB<0> to an inverted data bit DB<n-1> of the data bits from the LSB D<0> to the MSB D<n-1> constituting the codeword D<0:n-1> may be input to the second input terminals of the first to $n^{th}$ shared MUXs 454(1), . . . , 454(n-1) and 454(n), respectively. The "n"-bit output data $X(\alpha\_0)$, $X(\alpha\_1)$, $X(\alpha\_2)$, . . . , and $X(\alpha\_n-1)$ may be input to the third input terminals of the first to $n^{th}$ shared MUXs 454(1), . . . , 454(n-1) and 454(n), respectively. That is, data bits from the LSB $X(\alpha\_0)$ to the MSB $X(\alpha\_n-1)$ of the "n"-bit output data may be input to the third input terminals of the first to $n^{th}$ shared MUXs 454(1), . . . , 454(n-1) and 454(n), respectively. A decoded output signal may be output through the output terminals of the first to $n^{th}$ shared MUXs 454(1), . . . , 454(n-1) and 454(n). That is, an LSB DEC_OUT<0> to an MSB DEC_OUT<n-1> of the decoded output signal may be output through the output terminals of the first to $n^{th}$ shared MUXs 454(1), . . . , 454(n-1) and 454(n), respectively.

An error correction operation will be described hereinafter in conjunction with an example in which an erroneous bit among the "n"-bit output data $X(\alpha\_0)$, $X(\alpha\_1)$, $X(\alpha\_2)$, . . . , and $X(\alpha\_n-1)$ output from the error location calculator 213 has a logic "high(1)" level and a non-erroneous bit among the "n"-bit output data $X(\alpha\_0)$, $X(\alpha\_1)$, $X(\alpha\_2)$, . . . , and $X(\alpha\_n-1)$ output from the error location calculator 213 has a logic "low(0)" level. If the LSB and the $(n-1)^{th}$ bit of the codeword D<0:n-1> are erroneous bits, the LSB $X(\alpha\_0)$ having a logic "high(1)" level may be input to the third input terminal of the first shared MUX 454(1) and the $(n-1)^{th}$ bit $X(\alpha\_n-2)$ having a logic "high (1)" level may be input to the third input terminal of the $(n-1)^{th}$ shared MUX 454(n-1). In such a case, the output data having a logic "low(0)" level may be input to the third input terminals of the remaining shared MUXs 454(2), . . . , 454(n-2) and 454(n). The first shared MUX 454(1) may output the inverted LSB DB<0> of the codeword D<0:n-1> input through the second input terminal of the first shared MUX 454(1) as the LSB DEC_OUT<0> of the decoded output signal to correct an error of the LSB of the codeword D<0:n-1>. Similarly, the $(n-1)^{th}$ shared MUX 454(n-1) may output the inverted $(n-1)^{th}$ bit DB<n-2> of the codeword D<0:n-1> input through the second input terminal of the $(n-1)^{th}$ shared MUX 454(n-1) as the $(n-1)^{th}$ bit DEC_OUT<n-2> of the decoded output signal to correct an error of the $(n-1)^{th}$ bit of the codeword D<0:n-1>. In contrast, each of the remaining shared MUXs 454(2), . . . , 454(n-2) and 454(n) may output the bit of the codeword D<0:n-1> input through the first input terminal thereof as the corresponding bit of the decoded output signal.

As described above, in terms of the number of the shared XOR arithmetic elements, "2t×(n-1)" shared XOR arithmetic elements may be used to perform XOR operations as a part of the syndrome operation, and "3t+1" shared XOR arithmetic elements may be used to perform XOR operations as a part of the error location polynomial operation. In addition, "t×n" shared XOR arithmetic elements may be used to perform XOR operations as a part of the error location operation. Thus, if logic circuits are not shared, "2t×(n-1)+(3t+1)+t×n" shared XOR arithmetic elements may be required to perform the syndrome operation, the error location polynomial operation, and the error location operation. However, according to the embodiments using the shared logic circuit 210, only "2t×(n-1)" shared XOR arithmetic elements may be required to perform the syndrome operation, the error location polynomial operation, and the error location operation. For example, if the number "n" of the bits included in the codeword is thirty one and the maximum number "t" of error correctable bits is two, one hundred and eighty nine XOR arithmetic elements may be required to perform the syndrome operation, the error location polynomial operation, and the error location operation if the shared logic circuit 210 is not used. However, according to the embodiments using the shared logic circuit 210, only one hundred and twenty shared XOR arithmetic elements may be required to perform the syndrome operation, the error location polynomial operation, and the error location operation. As a result, according to the embodiments, the number of the XOR arithmetic elements may be reduced by about 36.5%.

In terms of the number of the shared GF multipliers, "2t×(n-1)" shared GF multipliers may be used to perform the syndrome operation, and "2×(3t+1)" shared GF multipliers may be used to perform the error location polynomial operation. In addition, "t×(n-1)" shared GF multipliers may be used to perform the error location operation. Thus, if logic circuits are not shared, "2t×(n-1)+2×(3t+1)+t×(n-1)" shared GF multipliers may be required to perform the syndrome operation, the error location polynomial operation, and the error location operation. However, according to the embodiments using the shared logic circuit 210, only "2t×(n-1)" shared GF multipliers may be required to perform the syndrome operation, the error location polynomial operation, and the error location operation. For example, if the number "n" of the bits included in the codeword is thirty one and the maximum number "t" of error correctable bits is two, one hundred and ninety six GF multipliers may be required to perform the syndrome operation, the error location polynomial operation, and the error location operation if the shared logic circuit 210 is not used. However, according to the embodiments using the shared logic circuit 210, only one hundred and twenty shared GF multipliers may be required to perform the syndrome operation, the error location polynomial operation, and the error location operation. As a result, according to the embodiments, the number of the GF multipliers may be reduced by about 38.8%.

In terms of the number of the shared MUXs, three shared MUXs may be used to perform the error location polynomial operation, and "n" shared MUXs may be used to perform the error correction operation. Thus, if the shared logic circuit 210 is not used, "3+n" shared MUXs may be required to perform the error location polynomial operation and the error correction operation. However, according to the embodiments using the shared logic circuit 210, only "n" shared MUXs may be required to perform the error location polynomial operation and the error correction operation. For example, if the number "n" of the bits included in the codeword is thirty one and the maximum number "t" of error correctable bits is two, thirty four MUXs may be required to perform the error location polynomial operation and the error correction operation if the shared logic circuit 210 is not used. However, according to the embodiments using the shared logic circuit 210, only thirty one shared MUXs may be required to perform the error location polynomial operation and the error correction operation. As a result, according to the embodiments, the number of the MUXs may be reduced by about 9%.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. An error correction code (ECC) decoder comprising:
   a finite state machine (FSM) controller configured to generate a first control signal and a second control signal each corresponding to a certain state of a plurality of states; and
   a shared logic circuit configured to include a plurality of shared Galois field (GF) multipliers, a plurality of shared XOR arithmetic elements, and a plurality of shared multiplexers (MUXs), which are used for an operation selected between a syndrome operation, an error location polynomial operation, an error location operation, and an error correction operation, in response to the first and second control signals.

2. The ECC decoder of claim 1, wherein the FSM controller circularly operates based on the plurality of states including a first state defined as an initialized state, a second state defined as a syndrome operation state, a third state defined as an error location polynomial operation state, a fourth state defined as an error location operation state, and a fifth state defined as an error correction operation state.

3. The ECC decoder of claim 2, wherein the FSM controller generates the first and second control signals maintaining a current state or transitioning to a next state in response to an input control signal.

4. The ECC decoder of claim 2, wherein the FSM controller:

generates the first and second control signals during the first state so that the shared logic circuit maintains a standby state;
generates the first and second control signals during the second state so that the shared logic circuit performs the syndrome operation;
generates the first and second control signals during the third state so that the shared logic circuit performs the error location polynomial operation;
generates the first and second control signals during the fourth state so that the shared logic circuit performs the error location operation; and
generates the first and second control signals during the fifth state so that the shared logic circuit performs the error correction operation.

5. The ECC decoder of claim 1, wherein the shared GF multipliers and the shared XOR arithmetic elements are used to perform any one of the syndrome operation, the error location polynomial operation, and the error location operation, according to the first control signal.

6. The ECC decoder of claim 1, wherein the shared MUXs are used to perform any one operation of the error location polynomial operation and the error correction operation according to the second control signal.

7. The ECC decoder of claim 1, wherein each of the plurality of shared GF multipliers includes:
   a first MUX including an input terminal receiving the first control signal from the FSM controller, a first state input terminal receiving first syndrome operation data to be used for the syndrome operation, a second state input terminal receiving first error location polynomial operation data to be used for the error location polynomial operation, a third state input terminal receiving first error location operation data to be used for the error location operation, and an output terminal;
   a second MUX including an input terminal receiving the first control signal from the FSM controller, a first state input terminal receiving second syndrome operation data to be used for the syndrome operation, a second state input terminal receiving second error location polynomial operation data to be used for the error location polynomial operation, a third state input terminal receiving second error location operation data to be used for the error location operation, and an output terminal; and
   a GF multiplier configured to perform a GF multiplying operation on output signals output through the output terminals of the first and second MUXs to output the result of the GF multiplying operation.

8. The ECC decoder of claim 7, wherein:
   the first syndrome operation data is one of data bits included in a codeword;
   the second syndrome operation data is one of GF primitive elements;
   the first and second error location polynomial operation data are one of control signals and one of error location polynomial coefficients, respectively;
   the first error location operation data is one of the error location polynomial coefficients; and
   the second error location operation data is one of the GF primitive elements.

9. The ECC decoder of claim 1, wherein each of the plurality of shared XOR arithmetic elements includes:
   a first MUX including an input terminal receiving the first control signal from the FSM controller, a first state input terminal receiving third syndrome operation data to be used for the syndrome operation, a second state input terminal receiving third error location polynomial operation data to be used for the error location polynomial operation, a third state input terminal receiving third error location operation data to be used for the error location operation, and an output terminal;

a second MUX including an input terminal receiving the first control signal from the FSM controller, a first state input terminal receiving fourth syndrome operation data to be used for the syndrome operation, a second state input terminal receiving fourth error location polynomial operation data to be used for the error location polynomial operation, a third state input terminal receiving fourth error location operation data to be used for the error location operation, and an output terminal; and an XOR arithmetic element configured to perform an XOR operation on output signals output through the output terminals of the first and second MUXs to output the result of the XOR operation.

10. The ECC decoder of claim 9, wherein:
the third and fourth syndrome operation data are output signals of first and second shared GF multipliers, respectively, used in the syndrome operation, among the plurality of shared GF multipliers;
the third and fourth error location polynomial operation data are output signals of first and second shared GF multipliers, respectively, used in the error location polynomial operation, among the plurality of shared GF multipliers;
the third error location operation data is one of error location polynomial coefficients; and
the fourth error location operation data is one of output signals of the shared GF multipliers used in the error location operation, among the plurality of shared GF multipliers.

11. The ECC decoder of claim 1, wherein the shared logic circuit receives a codeword, and wherein if the number of bits included in the codeword is "n" and the maximum number of error correctable bits is "t," the number of the shared GF multipliers is "2t×(n−1)," the number of the shared XOR arithmetic elements is "2t×(n−1)," and the number of the shared MUXs is "n".

12. The ECC decoder of claim 11, wherein:
all of the "2t×(n−1)" shared GF multipliers and all of the "2t×(n−1)" shared XOR arithmetic elements are used in the syndrome operation;
"2×(3t+1)" shared GF multipliers among the "2t×(n−1)" shared GF multipliers, "3t+1" shared XOR arithmetic elements among the "2t×(n−1)" shared XOR arithmetic elements, and three shared MUXs among the "n" shared MUXs are used in the error location polynomial operation;
"t×(n−1)" shared GF multipliers among the "2t×(n−1)" shared GF multipliers and "t×n" shared XOR arithmetic elements among the "2t×(n−1)" shared XOR arithmetic elements are used in the error location operation; and all of the "n" shared MUXs are used in the error correction operation.

13. A method of decoding error correction codes, the method comprising:
providing a shared logic circuit including a plurality of shared Galois field (GF) multipliers, a plurality of shared XOR arithmetic elements, and a plurality of shared multiplexers (MUXs);
providing a finite state machine (FSM) controller generating a first control signal and a second control signal each corresponding to a certain state of a plurality of states; and
driving the shared logic circuit including the plurality of shared GF multipliers, the plurality of shared XOR arithmetic elements and the plurality of shared MUXs to perform an operation selected between a syndrome operation, an error location polynomial operation, an error location operation, and an error correction operation, in response to the first and second control signals.

14. The method of claim 13, wherein the FSM controller circularly operates based on the plurality of states including a first state defined as an initialized state, a second state defined as a syndrome operation state, a third state defined as an error location polynomial operation state, a fourth state defined as an error location operation state, and a fifth state defined as an error correction operation state.

15. The method of claim 14, wherein the FSM controller generates the first and second control signals maintaining a current state or transitioning to a next state in response to an input control signal.

16. The method of claim 14, wherein the FSM controller:
generates the first and second control signals during the first state so that the shared logic circuit maintains a standby state;
generates the first and second control signals during the second state so that the shared logic circuit performs the syndrome operation;
generates the first and second control signals during the third state so that the shared logic circuit performs the error location polynomial operation;
generates the first and second control signals during the fourth state so that the shared logic circuit performs the error location operation; and
generates the first and second control signals during the fifth state so that the shared logic circuit performs the error correction operation.

17. The method of claim 13, wherein the shared GF multipliers and the shared XOR arithmetic elements are used to perform any one of the syndrome operation, the error location polynomial operation, and the error location operation, according to the first control signal.

18. The method of claim 13, wherein the shared MUXs are used to perform any one operation of the error location polynomial operation and the error correction operation according to the second control signal.

* * * * *